United States Patent [19]

Eror et al.

[11] Patent Number: 4,915,564
[45] Date of Patent: Apr. 10, 1990

[54] METHOD AND APPARATUS FOR HANDLING AND PROCESSING WAFER-LIKE MATERIALS

[75] Inventors: Miroslav Eror, Old Tappan, N.J.; Richard E. Biehl, Pearl River, N.Y.

[73] Assignee: Materials Research Corporation, Orangeburg, N.Y.

[21] Appl. No.: 222,328

[22] Filed: Jul. 20, 1988

Related U.S. Application Data

[63] Continuation of Ser. No. 112,777, Oct. 22, 1987, abandoned, which is a continuation of Ser. No. 848,297, Apr. 4, 1986, abandoned.

[51] Int. Cl.⁴ ............................................. B65G 65/00
[52] U.S. Cl. ................................. 414/217; 414/225; 414/236; 414/737; 414/786
[58] Field of Search ............... 414/217, 219, 222, 223, 414/225, 416, 780, 781, 783, 784, 786, 757, 736, 744.2, 737; 294/2, 64.1; 29/740, 743; 118/500, 729, 730; 204/298; 198/394, 346.2, 468.4; 901/40

[56] References Cited

U.S. PATENT DOCUMENTS

| | | | |
|---|---|---|---|
| 2,510,678 | 6/1950 | Bower | 414/783 X |
| 3,823,836 | 7/1974 | Cheney et al. | 414/225 |
| 4,336,438 | 6/1982 | Uehara et al. | 414/222 X |
| 4,388,034 | 6/1983 | Takahashi | 204/298 X |
| 4,416,577 | 11/1983 | Inaba et al. | 414/736 X |
| 4,465,416 | 8/1984 | Burkhalter et al. | 414/217 |
| 4,498,416 | 2/1985 | Bouchaib | 414/222 X |
| 4,501,527 | 2/1985 | Jacoby et al. | 418/225 |
| 4,529,353 | 7/1985 | Dean et al. | 414/225 X |
| 4,548,699 | 10/1985 | Hutchinson et al. | 414/217 X |
| 4,584,045 | 4/1986 | Richards | 204/298 X |
| 4,632,624 | 12/1986 | Mirkovich et al. | 414/222 X |
| 4,639,030 | 1/1987 | Bini | 294/64.1 |
| 4,643,629 | 2/1987 | Takahashi et al. | 414/222 X |
| 4,759,681 | 7/1988 | Nogami | 414/222 X |

FOREIGN PATENT DOCUMENTS 2131390  6/1984 United Kingdom ................ 414/736

OTHER PUBLICATIONS

Western Electric Technical Digest No. 49, Jan. 1978, "Automatic Wafer Transfer and Turnover Tool", B. C. Abraham, C. R. Fegley.

Primary Examiner—David A. Bucci
Attorney, Agent, or Firm—Wood, Herron & Evans

[57] ABSTRACT

An apparatus and method for moving a plurality of wafer-like articles such as semiconductor substrates back and forth between a carrier and a processing chamber maintained in an interior atmosphere isolated from that of the carrier. A translating arm pivotal about its center with a wafer engaging vacuum chuck at each end loads and retrieves articles from the carrier and exchanges articles at a support. The support centers an article thereon and translates it linearly to or from a load lock chamber. The chamber opens and closes about the article on the support to maintain isolation of the environments as the article passes therebetween. Within the interior atmosphere of the chamber, another arm pivotal at its center and having a vacuum chuck at each end exchanges articles on the support with still another arm, which is longitudinally rotatable and has a pair of vacuum chucks spaced both from a free end thereof, this arm being pivotal about its other end to move the articles in a horizontal plane, and then to rotate them to and from, and exchange them with, a vertical plane of the processing location. At all other times, the articles remain in a horizontal plane.

38 Claims, 26 Drawing Sheets

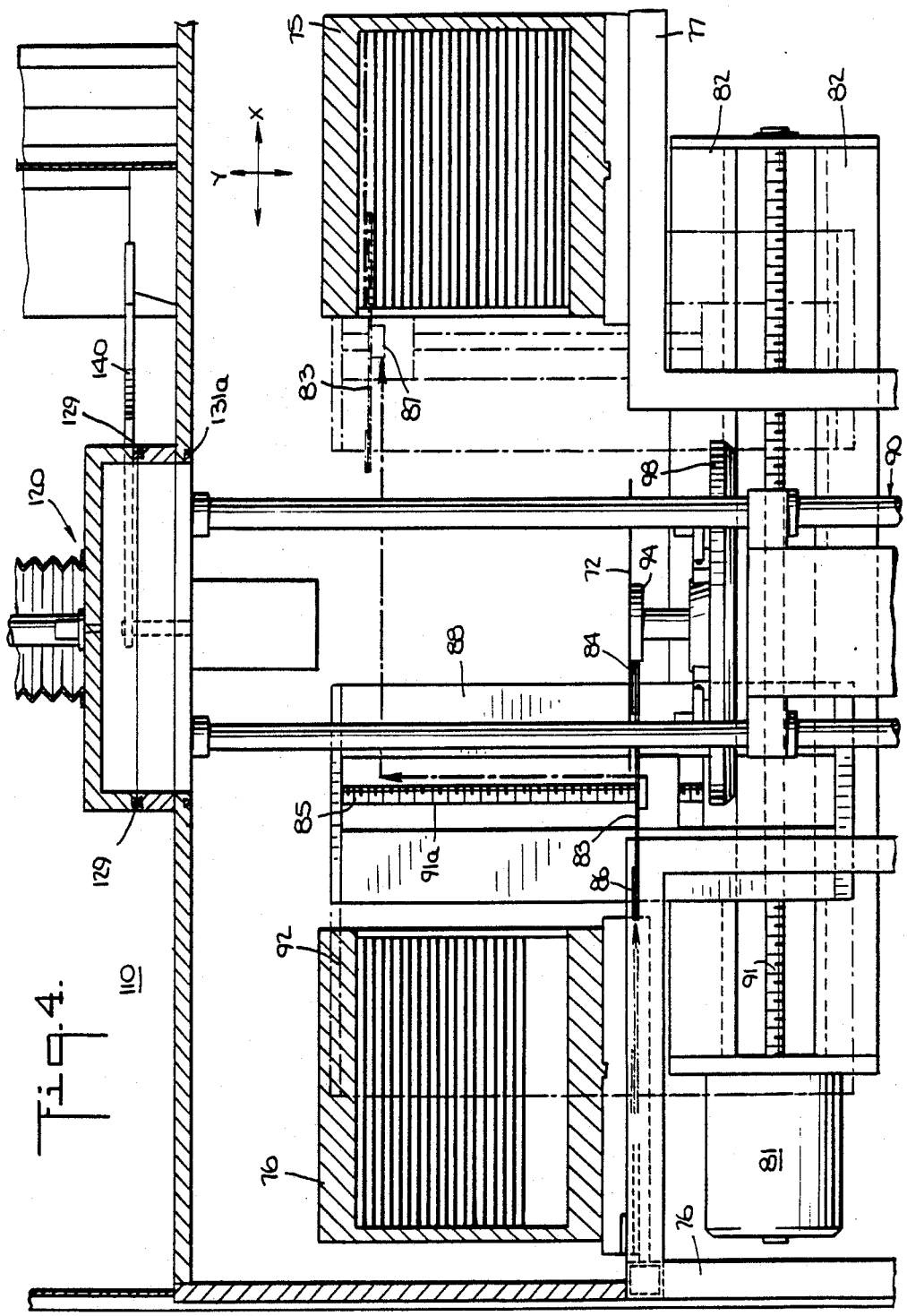

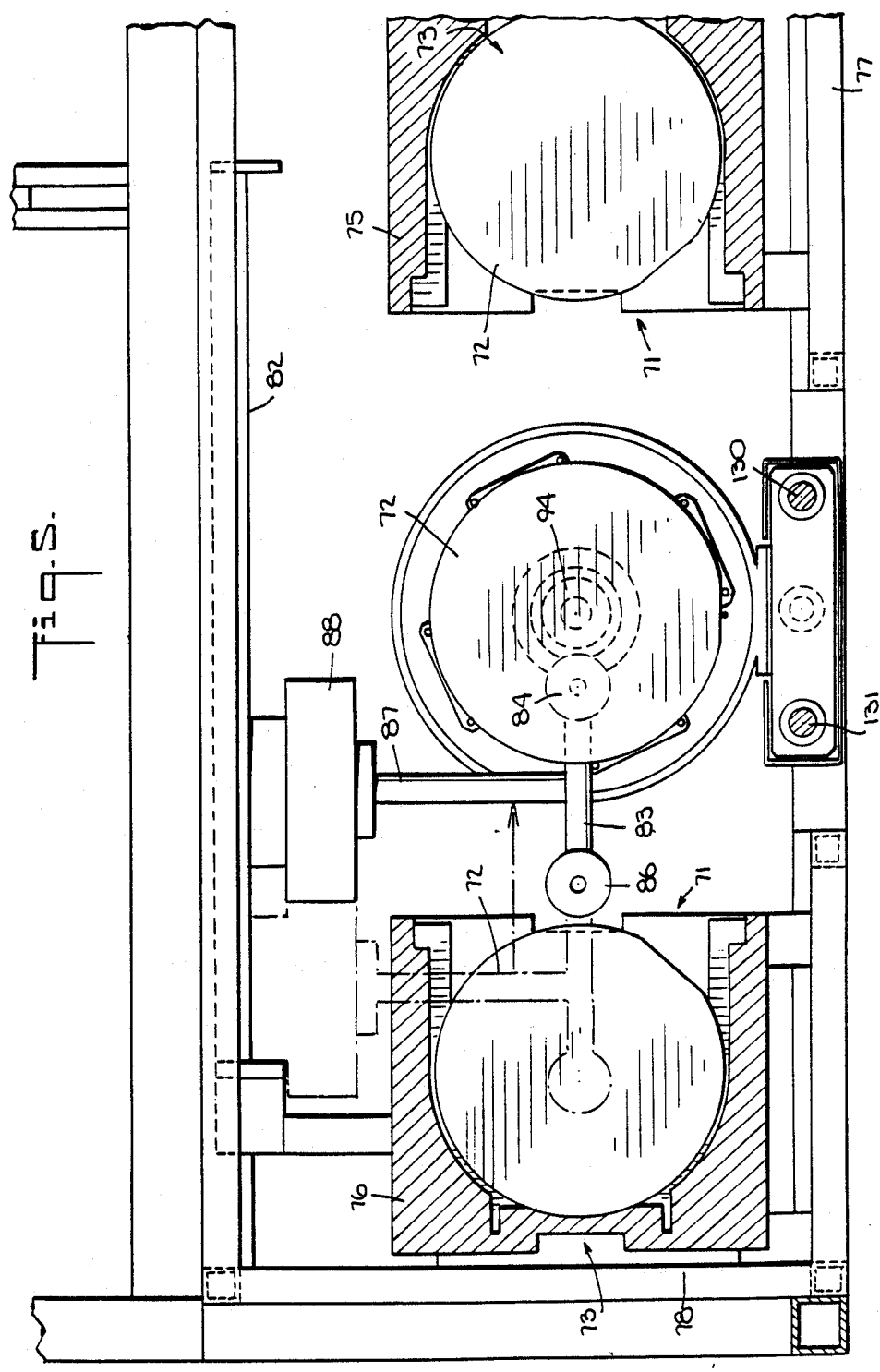

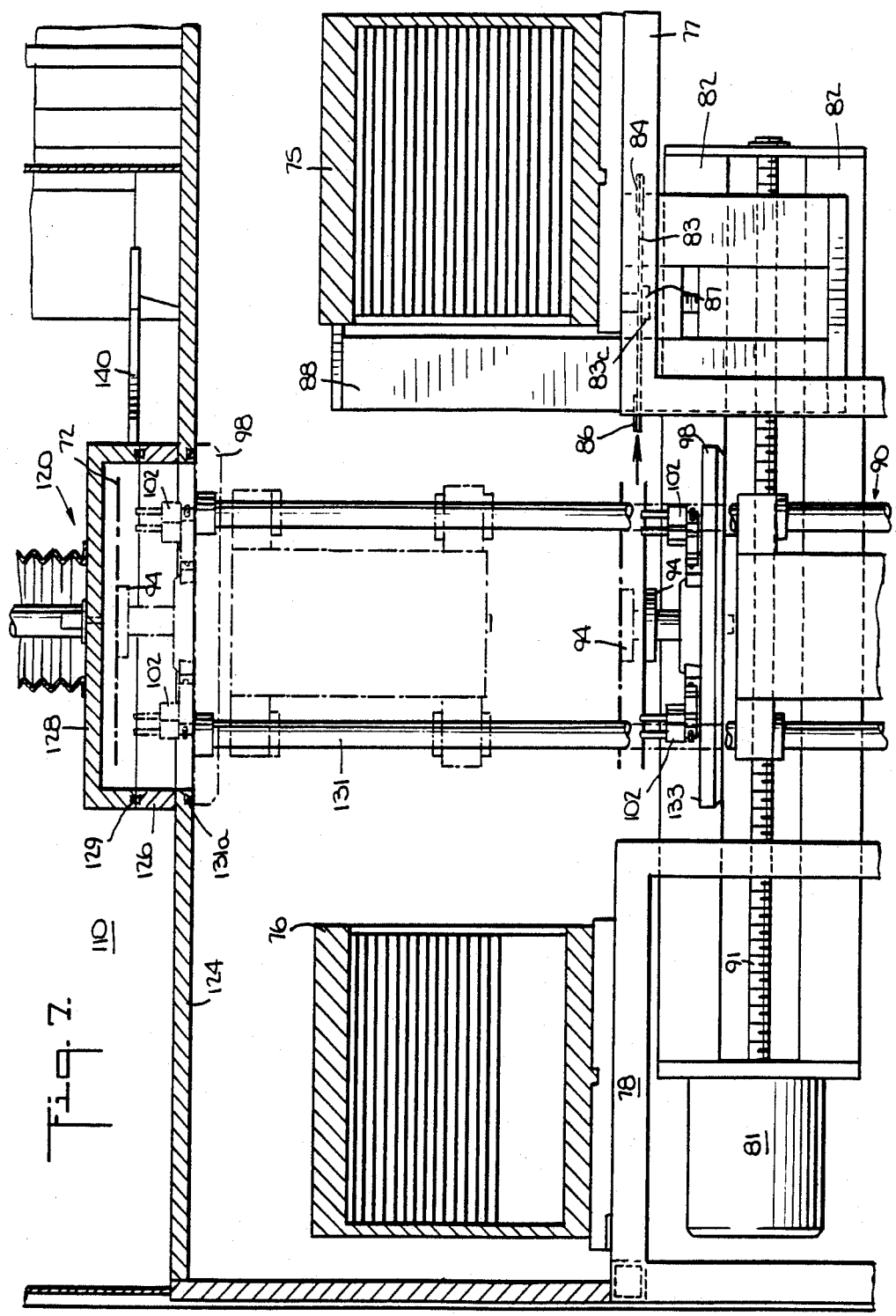

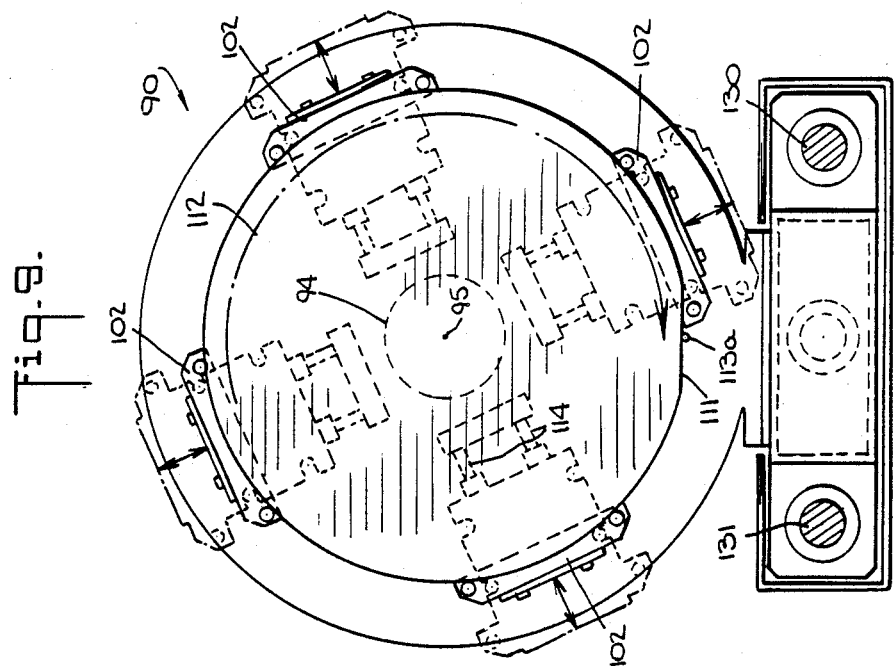
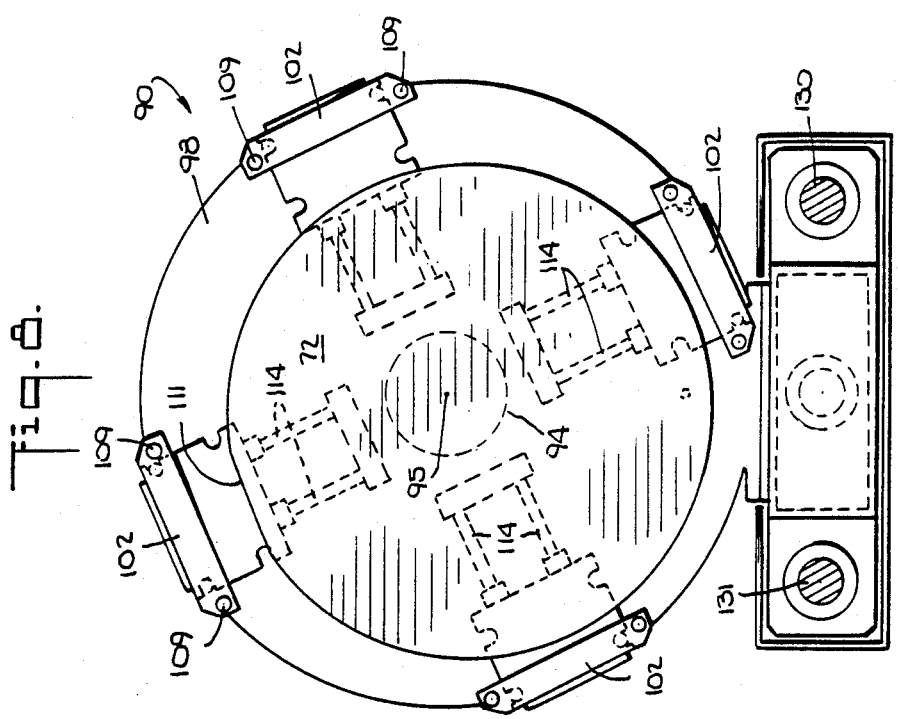

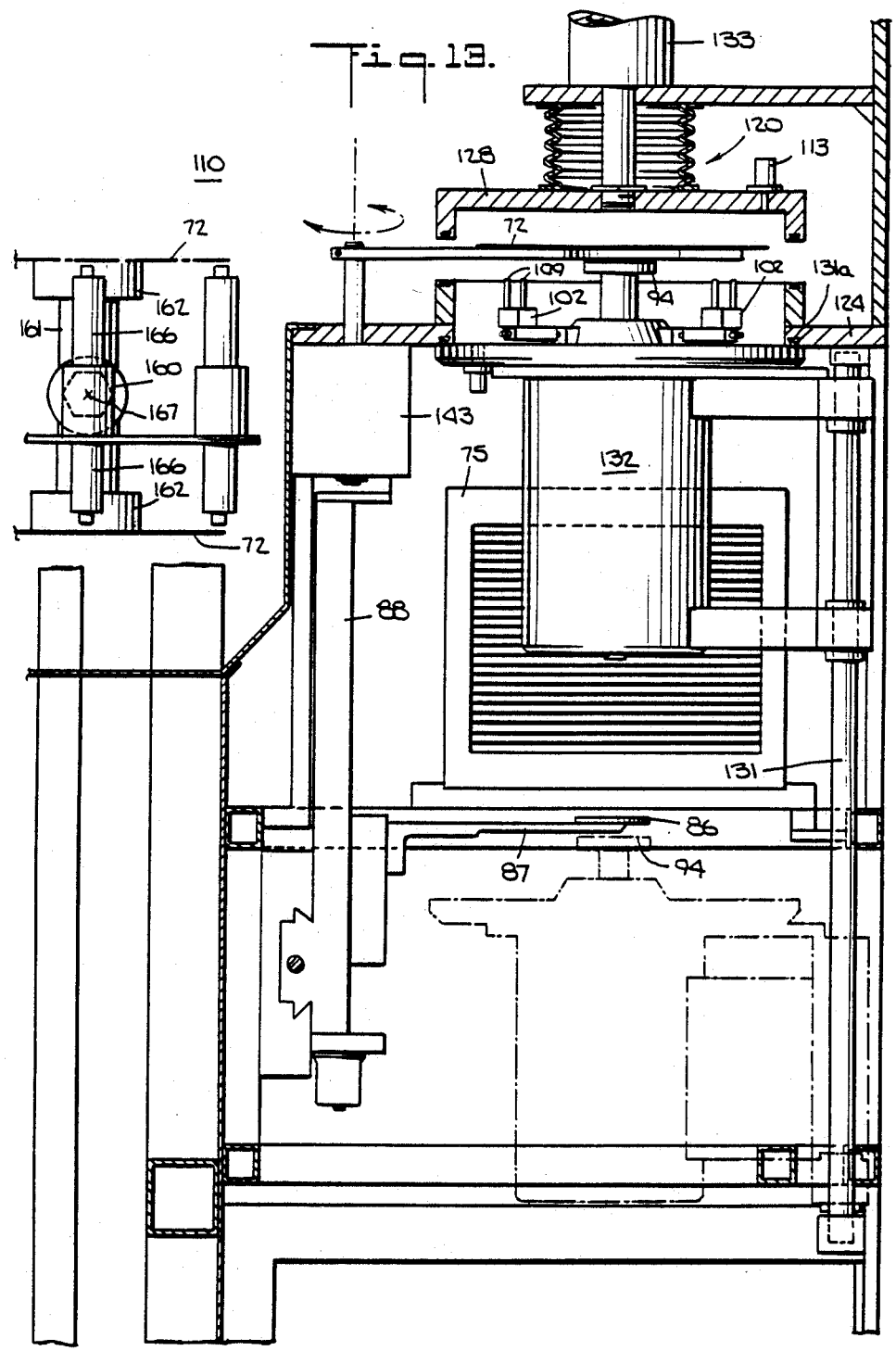

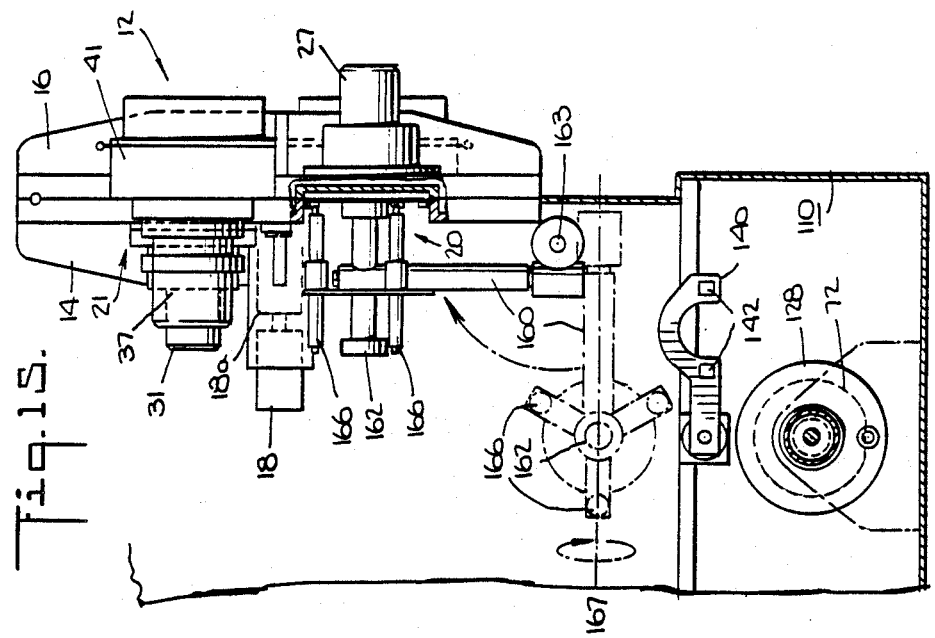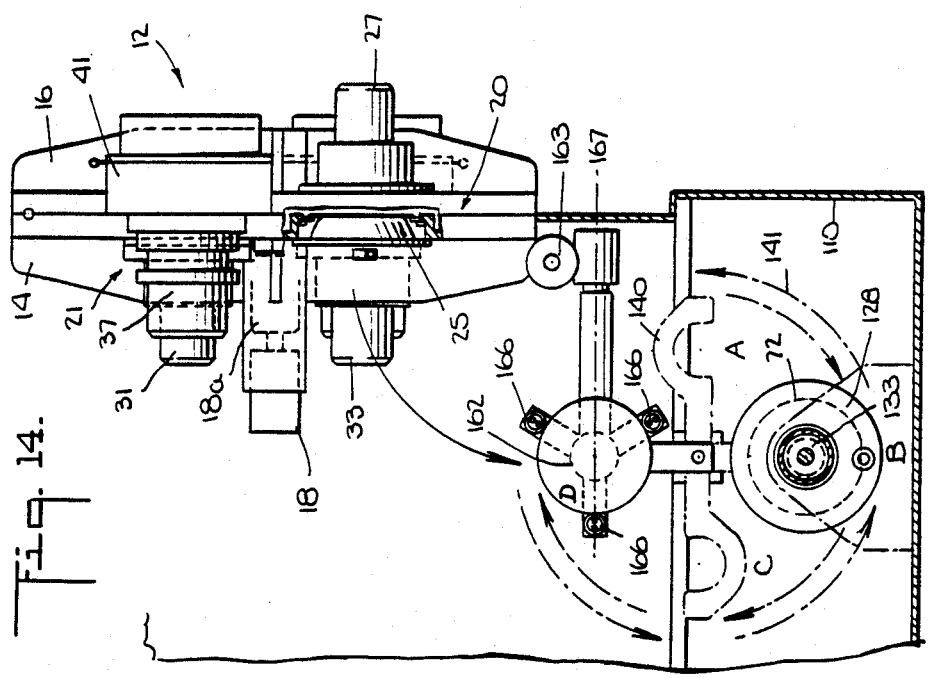

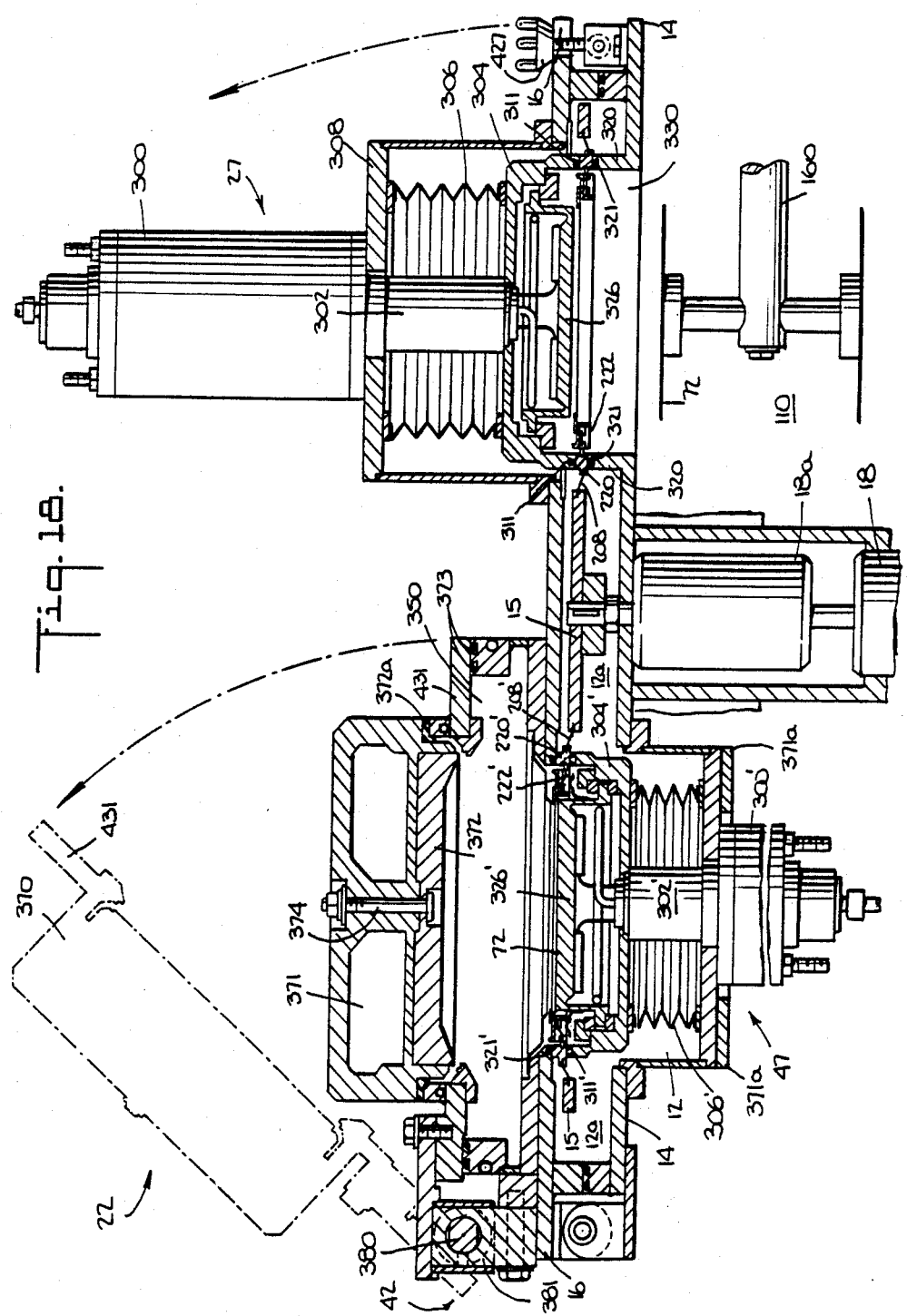

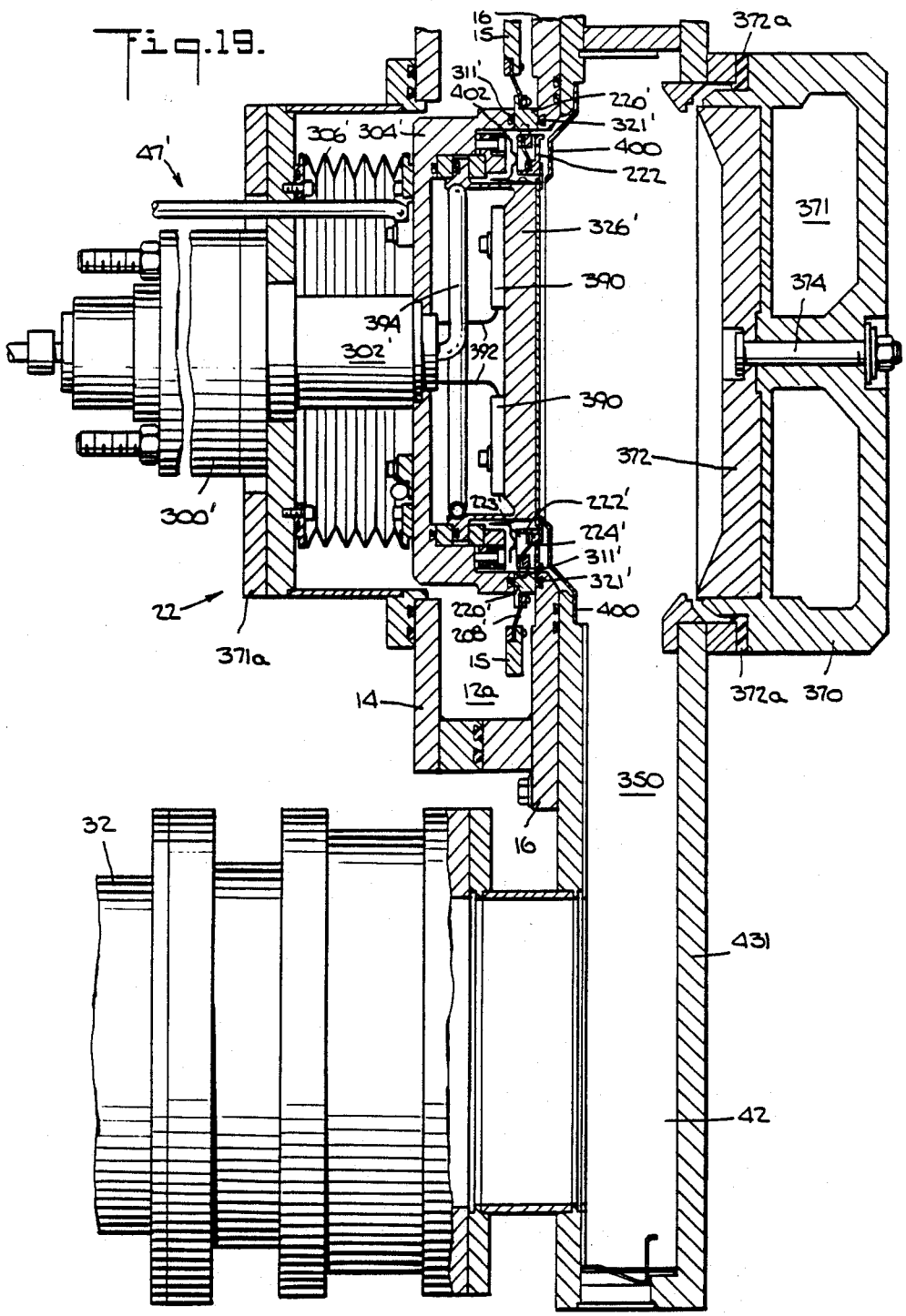

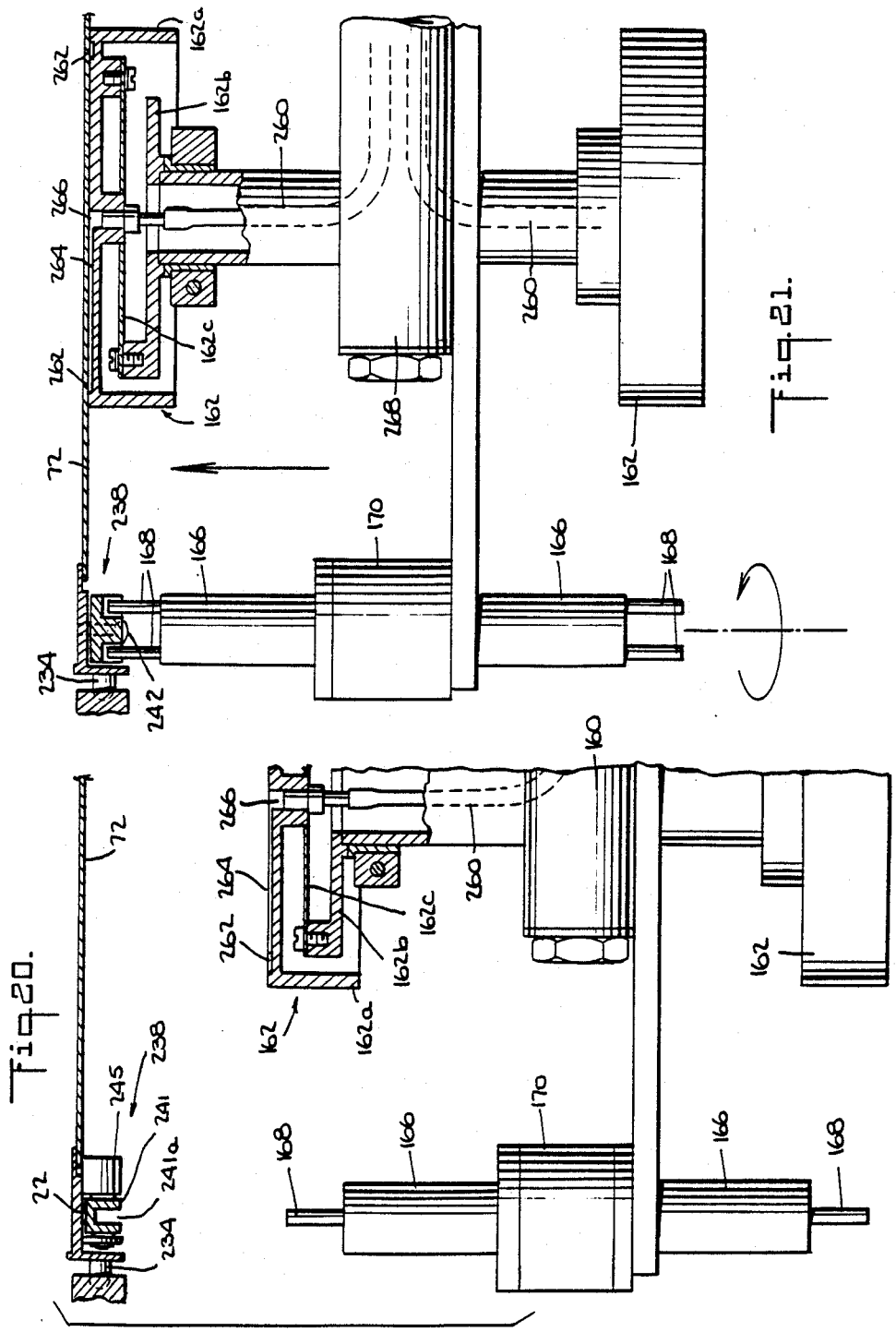

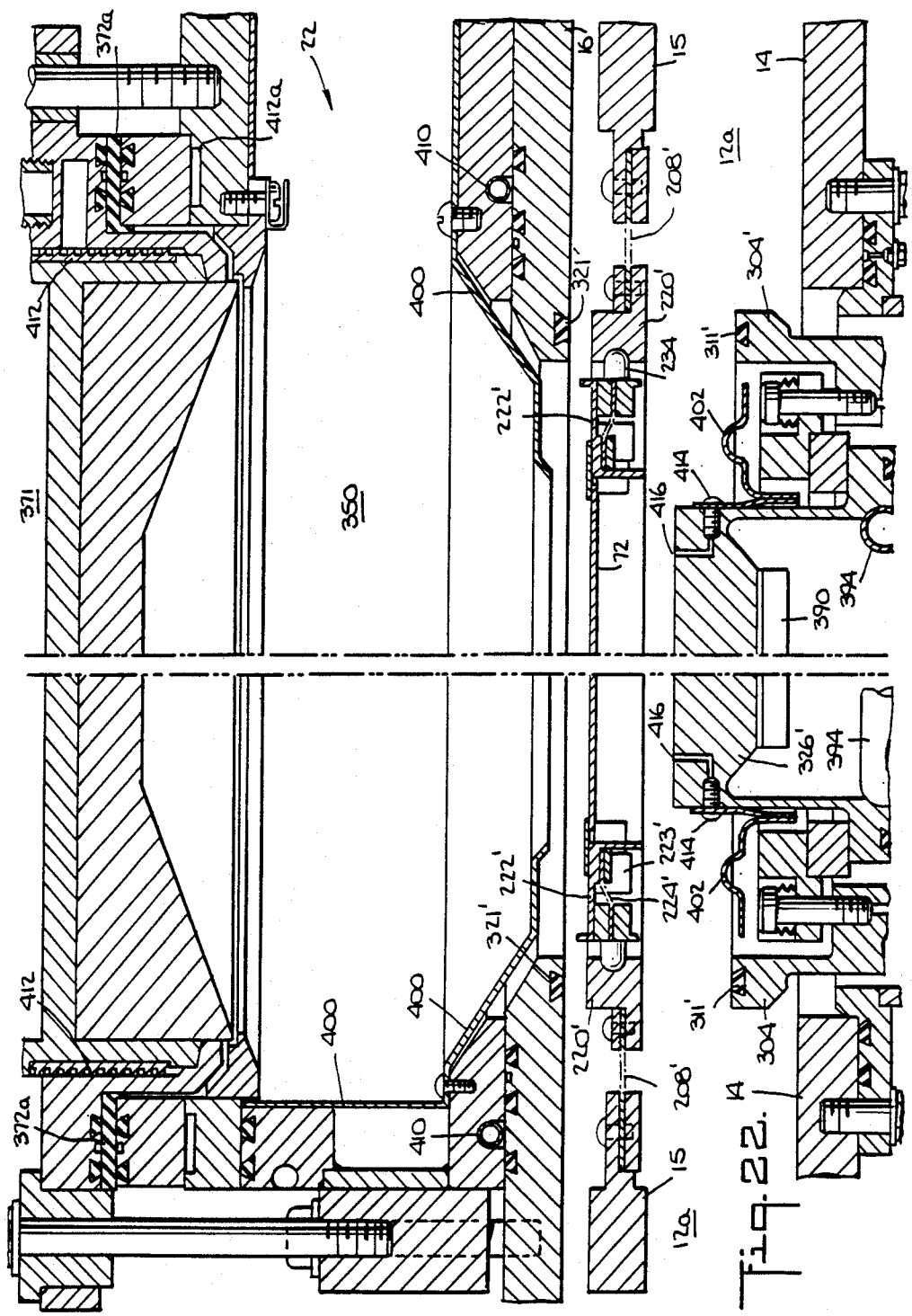

METHOD AND APPARATUS FOR HANDLING AND PROCESSING WAFER-LIKE MATERIALS

This application is a file wrapper continuation of application Ser. No. 07/112,777, now abandoned, filed Oct. 22, 1987 which is a continuation of Ser. No. 848,297 filed Apr. 21, 1986, now abandoned. This application is related to the following co-pending applications assigned to the assignee of this application:

Ser. No. 07/222,327, filed July 20, 1988, entitled METHOD AND APPARATUS FOR HANDLING AND PROCESSING WAFER-LIKE MATERIALS which is a file wrapper continuation of application Ser. No. 112,776 filed Oct. 22,1987, now abandoned, which was a continuation of application Ser. No. 06/848,687, filed Apr. 4, 1986, now abandoned; Ser. No. 07/095,100, filed Sept. 10, 1987 entitled CATHODE AND TARGET DESIGN FOR A VACUUM SPUTTERING APPARATUS which is a continuation of application Ser. No. 06/848,698, filed Apr. 4, 1986, now abandoned; Ser. No. 07/095,560, filed Sept. 10, 1987, entitled APPARATUS FOR IMPROVING THE UNIFORMITY OF ION BOMBARDMENT IN A MAGNETRON SPUTTERING SYSTEM which is a continuation of application Ser. No. 06/848,750, filed Apr. 4, 1986 now abandoned.

BACKGROUND OF THE INVENTION

The present invention relates to a method and apparatus for handling and processing wafer-like materials. In particular, the invention relates to a method and apparatus for handling and processing thin wafers, such as semiconductor substrates. The apparatus of the present invention can be used in systems for such purposes as etching of semiconductor wafer substrates and sputtering of deposits on such substrates.

Known designs for wafer processing machines allow wafers to be processed in vacuum environments. Generally, it is often necessary to perform sequentially more than one process on a substrate. For example, it may be necessary, after the wafer is introduced into the vacuum environment, to etch the wafer for preparing a surface for subsequent process steps. The next step may be the sputtering of a first metallic layer on the substrate and a further sputtering deposition step or steps may then follow. In each case, different gases may be introduced into the chamber for the different sputtering steps and different cathode target materials are used, depending on the material to be deposited onto the substrate. Accordingly, different gaseous and plasma conditions are present for the different process steps. Generally, the prior art devices cannot allow simultaneous processing by different processes using different gaseous atmospheres of more than one wafer at a time, because once wafers are introduced into the vacuum chamber, only that particular process using that particular gas can be performed on the wafers in the chamber. If more than one process is carried out simultaneously on different wafers using these apparatus, cross contamination of the vapors and gases from the different processes may occur. Accordingly, it is not possible in these prior art arrangements to process more than one wafer at a time if different processes using different gases are to be performed upon the wafers. Thus, for example, in these prior art machines which have a plurality of processing stations, if it is desired to operate with, for example, a first gas on a first of the wafers and a second gas on a second wafer, such would not be possible simultaneously. Instead, the entire vacuum chamber would have to be purged of the first gas and the second gas introduced before the second wafer could be processed. Additionally, if a process step is to be performed on only some, but not all, of the wafers in the chamber, because all wafers are exposed to the same environment, there is the possibility of contamination of those wafers which are not being processed.

Furthermore, it is also important that the wafers be processed without transfer of the wafer between different handling mechanisms once in the vacuum chamber. Generally, the wafers to be processed in apparatus of the present invention are fragile, and to avoid particulate formation or breakage, it is preferable to avoid transfer of the wafer between different transfer mechanisms.

Additionally, in wafer processing machinery, especially machinery employing sputtering devices, it is necessary to change cathodes and targets of the sputtering devices, for example, to replace a target which has been substantially used. The cathodes in sputtering equipment generally include means for providing electromagnetic fields around the target of a particular orientation and a target of the material to be sputtered which is biased at high voltages with respect to the support structure and the substrate upon which the deposits are made. This causes the material of the target to vaporize into a plasma and be deposited upon the substrate. Where it is desired simultaneously to process a plurality of substrates in different gaseous environments, it is convenient to be able to replace only that particular target which requires replacement without disturbing the controlled environments in other process chambers in which the other substrates are disposed.

SUMMARY OF THE INVENTION

Accordingly, it is an object of the present invention to provide a wafer processing machine which allows simultaneous processing of a plurality of wafer-like articles under different environmental conditions.

It is furthermore an object of the present invention to provide a processing apparatus for wafer-like articles which eliminates possibilities of cross contamination of the articles being processed.

It is yet another object of the present invention to provide an apparatus for processing wafer-like articles in a vacuum environment.

It is yet a further object of the present invention to provide an apparatus for processing wafer-like articles having a main vacuum chamber used for transferring the article between isolatable process chambers wherein the process steps are carried out.

It is furthermore an object of the present invention to provide a processing apparatus for wafer-like articles which eliminates particulate formation or breakage of the articles by preventing transfer of the article, once in the controlled vacuum environment, between different transfer mechanisms.

It is yet another object of the invention to provide a processing apparatus for wafer-like articles which insures optimum cleanliness of the articles being processed.

It is still yet a further object of the present invention to provide a processing apparatus for wafer-like articles wherein, when necessary to replace that part of the apparatus which requires replacement, for example, a cathode target, it is not necessary to shut down the entire machine or to disturb the controlled environments in other parts of the apparatus which do not require the replacement of a particular part.

It is yet still a further object of the invention to provide a processing apparatus for wafer-like articles having the ability to allow articles to be processed in parallel and wherein an article can be subjected to a selected one of a plurality of processes.

The above and other objects are achieved according to one aspect of the present invention by apparatus for transporting a wafer-like article and subjecting the article to at least one process step comprising means defining a first chamber maintained substantially continuously at a vacuum or pressure level, aperture means in the first chamber through which an article to be subjected to the process step can be introduced into the first chamber, means in the first chamber for receiving and holding the article, means for moving the article held by the receiving and holding means substantially in a plane of movement to a position in the first chamber adjacent where the process step is to be performed on the article, movable means for isolating the second chamber from communication with the first chamber while the process step is performed on the article and for thereafter opening the second chamber to the first chamber so that the second chamber is in communication with the first chamber after the article has been subjected to the process step, the receiving and holding means remaining in contact with the article during the performance of the process step, and means for removing the article from the first chamber after the article has been subjected to the process step.

In the preferred embodiment, the moving means comprises rotatable plate means disposed in the plane of movement and the means for removing the article comprises the aperture means through which the article is also inserted into the first chamber.

In a preferred embodiment, the receiving and holding means comprises first means coupled to the plate means and defining an inner open area, first resilient means coupling the plate means and the first means, second means disposed in the inner open area and coupled to the first means, the second means defining a further area contained within the inner open area for receiving the article, and second resilient means coupling the second means to the first means.

According to the invention, the first means comprises sealing surfaces on first and second surfaces thereof, and the movable means comprises closure means movable toward and away from one of the first and second surfaces and having a surface for engaging in sealing relationship with the one of the first and second surfaces of the first means, the means defining the first chamber having a further surface for engaging in sealing relationship with the other of the first and second surfaces of the first means, the first resilient means allowing the closure means to bias the other of the first and second surfaces of the first means against the further surface of the means defining the first chamber in a direction substantially perpendicular to the plane of the plate means, whereby when the closure means engages the one of the first and second surfaces and the other of the first and second surfaces engage the further surface, the second chamber is sealed from the first chamber. Preferably, the article comprises a circular wafer, the first means comprises first ring-shaped member means, the second means comprises second ring-shaped member means and the first and second resilient means comprise arcuate flat spring means.

Preferably, the closure means comprises cup-shaped means with the surface for engaging in sealing relationship comprising a rim of the cup-shaped means. Additionally, it is preferable that the second means is removably coupled to the first means by detent means so that it can be removed from the first means when necessary, for example, for cleaning purposes.

The second ring-shaped means preferably includes an edge along at least a part of an inner periphery thereof extending into the further area against which peripheral portions of the article can be received, and clamping means are provided comprising means disposed on the second means movable so that a portion thereof can be moved into a position extending over at least a part of the further area defined by the inside of the second means. Preferably the clamping means is rotatably movable over at least a part of the further area defined by the inside of the second means.

In a preferred embodiment, the rotatable plate means comprises disk means rotatably movable in the first chamber about a central axis, the disk means comprising means for holding a plurality of the receiving and holding means, the means defining the first chamber comprising means for supporting a plurality of work stations at positions spaced equi-angularly and equi-distantly about the central axis.

Preferably, the apparatus according to the invention also includes article handling means for inserting the article to be processed into the first chamber and for removing the article after processing from the first chamber. According to a preferred embodiment, the article handling means comprises means for retrieving an article from a carrier member and for placing the article on a movable support member, first arm means for receiving the article from the movable support member, and second arm means for receiving the article from the first arm means and for inserting the article into the aperture means in the first chamber. The first and second arm means preferably are bi-directional so that they also are used to remove a processed article from the chamber and return it to the carrier member. Preferably, the first and second arm means are disposed in a third chamber isolated from the first chamber and the external environment. The third chamber includes entry means for receiving an article from the movable support means, and the movable support means comprises means for engaging in sealing relationship with a sealing surface arranged around the entry means when an article is inserted through the entry means. The entry means further comprises movable sealing means disposed in the third chamber for forming a fourth chamber in the third chamber isolated from the third chamber.

In a preferred embodiment, the first arm means is movable in an arcuate path and the movable sealing means is movable so as to open the third chamber to the fourth chamber when the pressures in the third and fourth chambers have been substantially equalized. Preferably, the first and second arm means comprise vacuum chuck means for engaging the article. The second arm means is preferably pivotable in the first plane or a plane parallel to the first plane so that the end thereof defines an arcuate path for receiving the article at a defined position along the path and further is rotatable about a longitudinal extent of the second arm means. In a preferred embodiment, the second arm means comprises first and second vacuum chuck means, one of the vacuum chuck means adapted for receiving an article from the first arm means in the first plane or a plane parallel to the first plane and the other adapted for transferring an article to the first arm means in the first plane or a plane parallel to the first plane. The second arm means is adapted for rotating the article about the longitudinal extent of the second arm means so that the article can be inserted into the aperture means in the first chamber from the second arm means or received through the aperture means in the first chamber for transfer to the first arm means. Also, in the preferred embodiment, the second arm means includes locking and unlocking means for engaging with the clamping means to secure the article in the receiving and holding means or allow its removal.

According to a further aspect of the invention, an apparatus for holding a wafer-like article in a movable support means and for allowing movement transverse to the support means is provided comprising first means coupled to the support means and defining a first inner open area, first resilient means coupling the support means and the first means, second means disposed in the inner open area and coupled to the first means, the second means defining a second inner open area contained within the first area for receiving the article, second resilient means coupling the second means to the first means, and means disposed on the second means for securing the article disposed in the second area to the second means.

Preferably, according to this further aspect of the invention, the apparatus for holding a wafer-like article is disposed in a first chamber and a second chamber is in communication with the first chamber and the first means defines sealing surfaces on first and second surfaces thereof, one of the first and second surfaces being engageable in sealing relationship with a surface of a wall means of the first chamber and the other surface being engageable in sealing relationship with movable closure means for isolating the second chamber from the first chamber while a process step is performed on the article in the second chamber, the closure means comprising means movable toward and away from the article and having a further surface for engaging in sealing relationship with the other surface of the first means, the first resilient means allowing the closure means to bias the one of the first and second surfaces of the first means against the surface of the wall means in a direction substantially perpendicular to the plane of the wall means when the closure means moves towards and engages the other surface of the first means, the second chamber being isolated from the first chamber when the further surface of the closure means engages the other surface of the first means and the one surface of the first means engages with the surface of the wall means.

Preferably, according to this further aspect of the invention, the first means comprises first ring-shaped member means and the second means comprises second ring-shaped member means, the first and second ring-shaped member means being disposed concentrically. The first and second resilient means preferably comprise flat arcuate spring means.

According to this further aspect of the invention, the apparatus further comprises backing means coupled to the closure means and disposed in an area defined by the inside of the closure means for coming into close proximity with a surface of the article. The second resilient means comprises means for allowing the article to move substantially perpendicularly to a plane in which the first means is disposed when the backing means comes into close proximity with the article.

According to yet a further aspect of the present invention, apparatus for transporting a wafer-like article between first and second locations is provided comprising carrier means at the first location for supporting a plurality of the articles, means for retrieving an article from the carrier means and for placing the article on a movable support means, the movable support means comprising means for transferring the article to a first intermediate position, first arm means movable in a first plane for receiving the article from said movable support means at the first intermediate position, and second arm means movable in the first plane or a plane parallel thereto for receiving the article from the first arm means at a second intermediate position and for delivering the article to the second location.

According to this yet further aspect of the present invention, the first and second arm means are disposed in chamber means isolated from the external environment, the first location being in the external environment and the second location being in communication with the environment in the chamber means. The chamber means preferably includes entry means for receiving an article from the movable support means, the movable support means comprising means for engaging in sealing relationship with a sealing surface arranged around the entry means when an article is inserted through the entry means by the movable support means.

The entry means preferably comprises movable sealing means disposed in the chamber means for defining a further chamber means between the movable sealing means and the movable support means when the movable support means engages with the sealing surface surrounding the entry means, thereby isolating the further chamber means from the chamber means.

According to this yet further aspect of the invention, in a preferred embodiment, the first arm means is movable in an arcuate path in a first plane and the movable sealing means is movable so as to open the chamber means to the further chamber means when the pressure in the chamber means and further chamber means have substantially equalized, thereby allowing access by the first arm means to the article. Preferably, the first arm means comprises vacuum chuck means for engaging the article and the second arm means comprises means pivotable in the first plane or a plane parallel to the first plane and defining an arcuate path for receiving the article at the first intermediate position along the path and further is rotatable about a longitudinal extent of the second arm means. The second arm means preferably comprises first and second vacuum chuck means disposed at an end of the second arm means. One of the vacuum chuck means receives an article from the first arm means and transfers the article to the second location, which may be a load-lock of a vacuum chamber. The other vacuum chuck means receives an article from the vacuum chamber and transfers it to the first arm means. The second arm means rotates the articles about its longitudinal extent so that one device can be used for simultaneously holding two articles, one of which may be a processed article and the other yet unprocessed.

According to yet still another aspect of the present invention, an apparatus adapted for moving a wafer-like article between first and second locations is provided comprising bi-directional longitudinally extending arm means having an end movable in a first plane along a path for receiving the article at the first location along the path and for transferring the article to the second location and for receiving an article at the second location along the path and transferring the article to the first location, at least two engaging means disposed at an end of the arm means, the first and second engaging means being rotatable about the longitudinally extending arm means between the first plane and any of a plurality of further planes, whereby the article can be transferred between the first and second locations by a combination of movement in the first plane and rotation about the longitudinally extending arm means. Preferably, the engaging means each comprise vacuum chuck means.

Preferably, the apparatus includes a carrier means for holding a plurality of articles disposed adjacent the first location and the article is subjected to a process step at the second location and either one of the first and second vacuum chuck means engages an article at the first location to be processed at the second location and the other vacuum chuck means engages an article which has been processed at the second location and returns the article to the first location. Preferably, the second location comprises a vacuum chamber having an entry means defined by a load-lock door, and the apparatus further comprises means for opening the door and means in the chamber for holding an article to be processed in the chamber, the holding means including means for clamping the article thereto, the longitudinally extending arm means further comprising means for actuating the clamping means. The actuating means preferably comprises means disposed adjacent the first and second vacuum chuck means and extending perpendicularly to the longitudinally extending arm means for engaging the clamping means.

Preferably, the holding means comprises a plurality of clamping means and the longitudinally extending arm means includes a plurality of actuating means for engaging corresponding ones of the clamping means. Additionally, in a preferred embodiment, the clamping means comprises rotatable means for clamping an article between a first surface and an extension of the clamping means, the clamping means comprising keyway means, the actuating means comprising key means for engaging with said keyway means, said key means being rotatable in two directions so as to secure the article between the extension of the clamping means and the first surface in one direction and allow the removal of the article by disengaging the extension of the clamping means from the article in the other direction.

Although the invention relates to apparatus for processing wafer-like articles in a vacuum atmosphere, it is to be understood that the invention could also be applied at pressures above atmospheric.

The above and other objects of the present invention are also achieved by methods for transporting wafer-like articles and subjecting the article to a process step and for handling wafer-like articles as will be explained in greater detail below.

BRIEF DESCRIPTION OF THE DRAWINGS

The invention will be described in greater detail in the following detailed description with reference to the drawings, in which:

FIG. 4 is a more detailed front sectional view of part of the apparatus of FIG. 1, and in particular, that part of the apparatus which transfers unprocessed and processed wafers from or to holding cassettes;

FIG. 5 is a top sectional view of that part of the apparatus shown in FIG. 4;

FIG. 7 shows the same view as FIG. 6 but shows additional steps of wafer handling and insertion of the wafer into a controlled environment of the apparatus according to the invention;

FIGS. 8 and 9 show further top sectional views of portions of the apparatus shown in FIGS. 4, 5, 6, and 7, and, in particular, those portions of the apparatus and the steps performed thereby directed to centering the wafer on a lifting table and aligning an indexing mark disposed on the perimeter of the wafer on the lifting table;

FIG. 13 is a side sectional view of a portion of the apparatus shown in FIG. 1, and in particular that portion of the apparatus which relates to handling of the wafer in a controlled environment of the apparatus according to the invention;

FIGS. 14 and 15 show top partially sectional views of the apparatus according to the invention illustrating steps in handling of wafers in the controlled environment before or after processing in the main processing apparatus proper;

FIG. 18 is the same view as FIG. 17 but shows the apparatus during a different step in the processing of a wafer;

FIG. 19 is a more detailed vertical sectional view of a portion of the apparatus shown in FIG. 18 taken through section lines 19—19 of FIG. 2;

FIGS. 20 and 21 show partial sectional views of portions of the apparatus for transferring a wafer to and from the main processing portion of the apparatus;

FIG. 22 is a detailed sectional view through a portion of the main processing apparatus showing one processing station according to the apparatus of the invention taken through section lines 22—22 of FIG. 17;

FIG. 23 is a sectional view like that of FIG. 22 showing a different step in the processing of a wafer;

DETAILED DESCRIPTION

Figure 1:
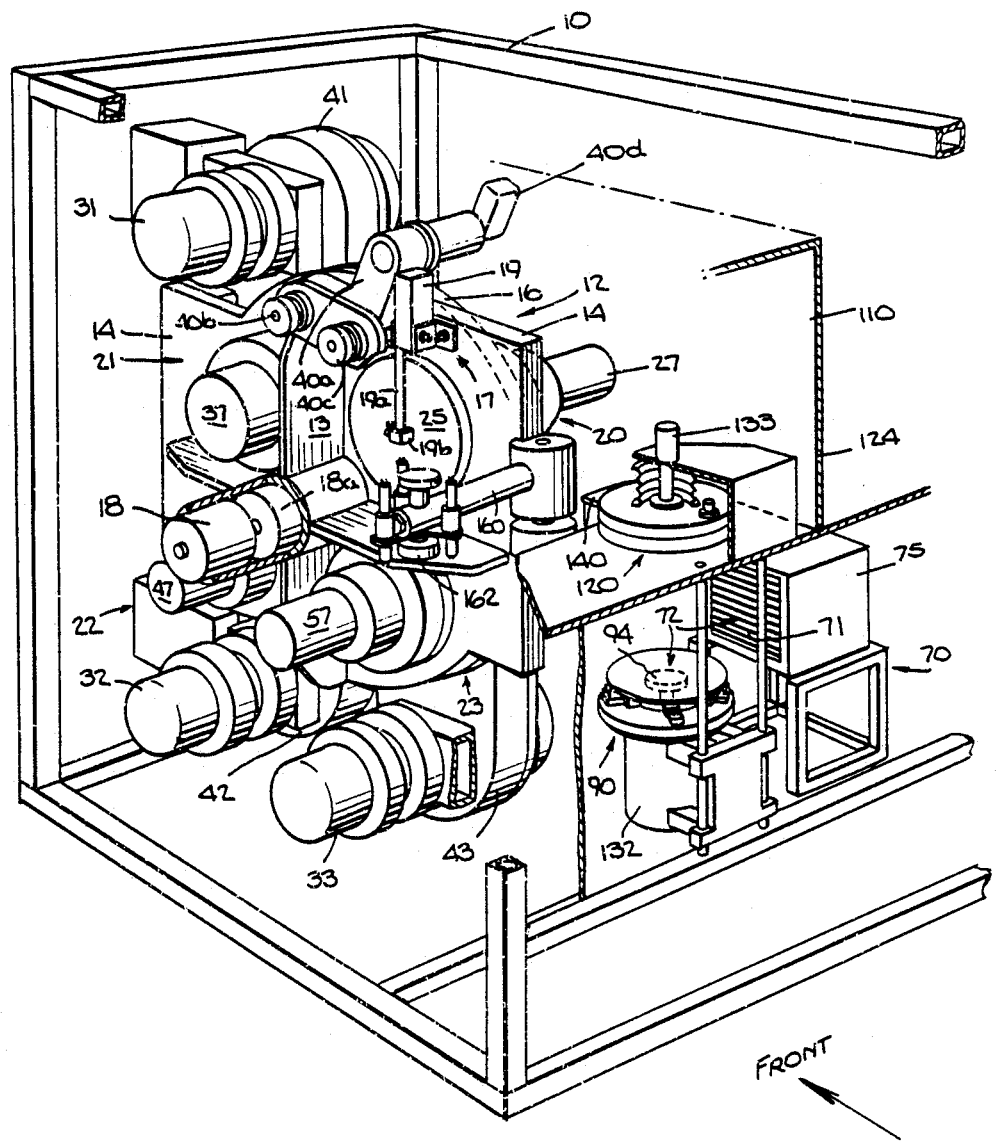
FIG. 1 is an overall cut-away perspective view of the apparatus according to the invention.

With reference now to the drawings, FIG. 1 shows a perspective view of the apparatus according to the invention. The front of the apparatus is considered to point to the right. The apparatus comprises, generally, a frame 10 to which is mounted a chamber 12, the chamber comprising two approximate half sections 14 and 16. The chamber includes, enclosed between sections 14 and 16, a rotatable index plate 15 (not shown in FIG. 1 but shown in detail in FIG. 26) which is driven by a motor 18 through a sealing member 18a, which may comprise a ferrofluidic sealing member. Each of the chamber halves 14 and 16 are reinforced by reinforcing structures 13 and 13a (not shown in FIG. 1, see FIG. 25), respectively. Chamber 12 halves 14 and 16 define a main plenum area 12a, shown in greater detail in FIG. 26. Attached to each of the half sections 14 and 16 of chamber 12 and disposed at equal angular intervals about the center of chamber 12 are the respective portions of four work stations 20, 21, 22 and 23. Station 20 comprises a load-lock station for the entry and removal of processed or unprocessed articles and stations 21, 22 and 23 comprise processing stations wherein various processing steps, such as etching and sputtering, may be carried out. In each work station, a different step may be carried out upon a substrate held by the rotatable index plate 15. Different processes may be simultaneously performed on different substrates at the different stations. In particular, station 20, which comprises the load-lock station, allows substrates to be inserted into or removed from the chamber 12 via a load-lock door 25 actuated by associated door operating mechanism 19, to be explained in greater detail later. Station 21 comprises a station wherein, for example, the substrate may be cleaned or etched to prepare it for further processing in stations 22 and 23, which may, for example, comprise sputtering stations wherein metallic layers are deposited on the substrate. Once a substrate has been rotated in the direction shown by arrow 17 through stations 20 to 23, it is then rotated further to complete a cycle of rotation to station 20, where the processed substrate is then removed through load-lock door 25. The apparatus allows four substrates to be disposed within the machine at any one time, and three different processes may be performed at stations 21, 22 and 23 on three different substrates simultaneously. Although four work stations are shown in the illustrated embodiment, a lesser or greater number of work stations could be provided by suitable modification of the apparatus.

Figure 25:
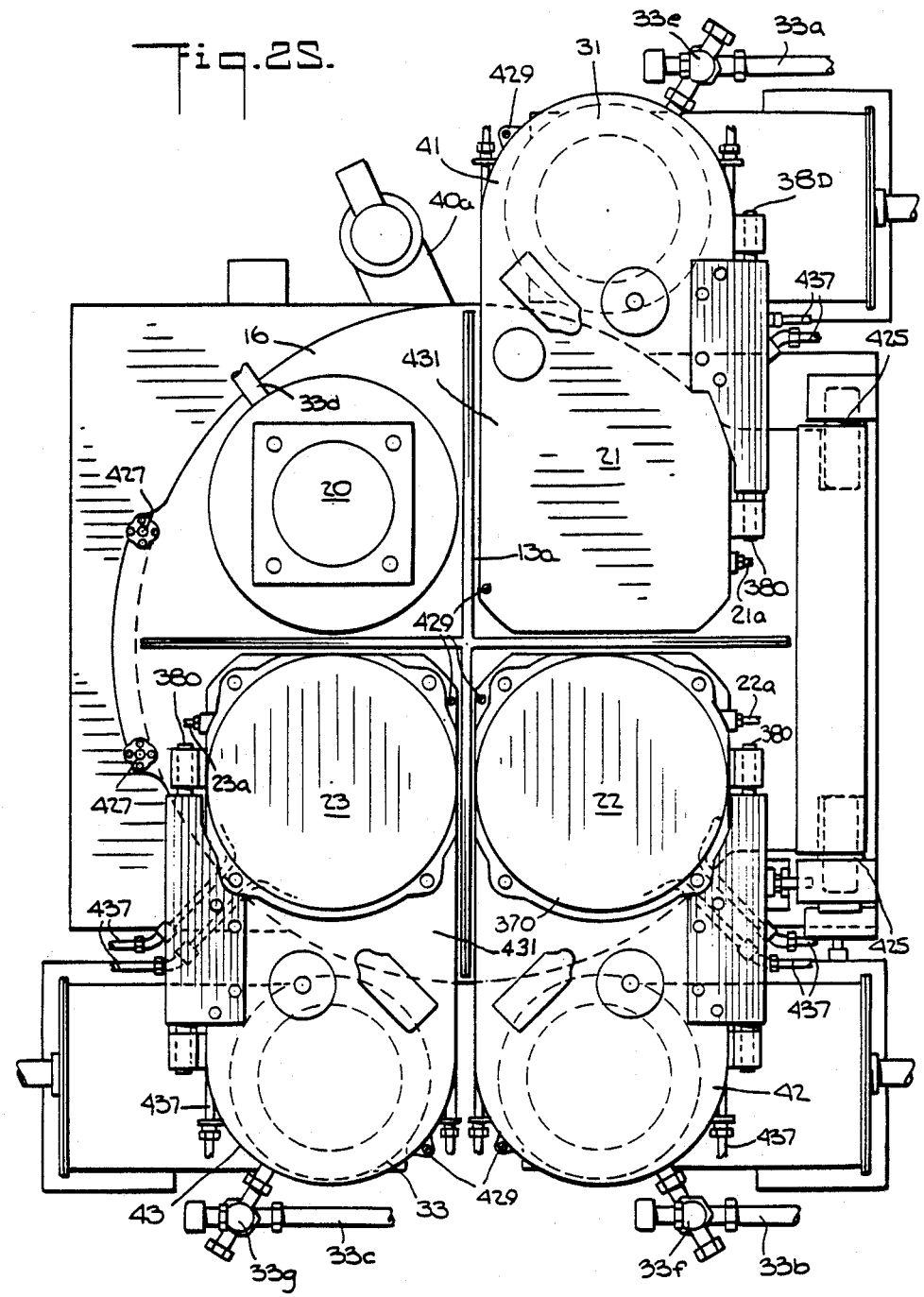
FIG. 25 is a right side view of the apparatus according to the invention.

The apparatus further includes a number of vacuum pumps 31, 32, 33 and 40d, which may be cryogenic vacuum pumps, for example, for providing the proper final vacuum levels in each of the volumes of the processing stations 21, 22 and 23 and load-lock station 20, respectively. As will be explained later, the apparatus of the invention allows the work station volumes to be isolated from the main chamber volume 12a during processing. Vacuum pumps 31, 32, 33 and 40d are coupled to the respective stations by respective manifold members 41, 42, 43 and 40a. Before cryogenic pumps 31, 32, 33 and 40d are activated, separate mechanical vacuum pumps connected to suitable fittings 33a, 33b, 33c, and 33d are activated to evacuate the respective chambers to a level close to the desired vacuum level. See FIG. 25. Cryogenic pumps 31, 32, 33 and 40d then are activated to bring the vacuum down to the desired levels. As shown in FIG. 25, fittings 33a, 33b and 33c include suitable valve members 33e, 33f and 33g, respectively, for disconnecting the mechanical vacuum sources from the respective processing chambers 21, 22 and 23, respectively.

Figure 26:
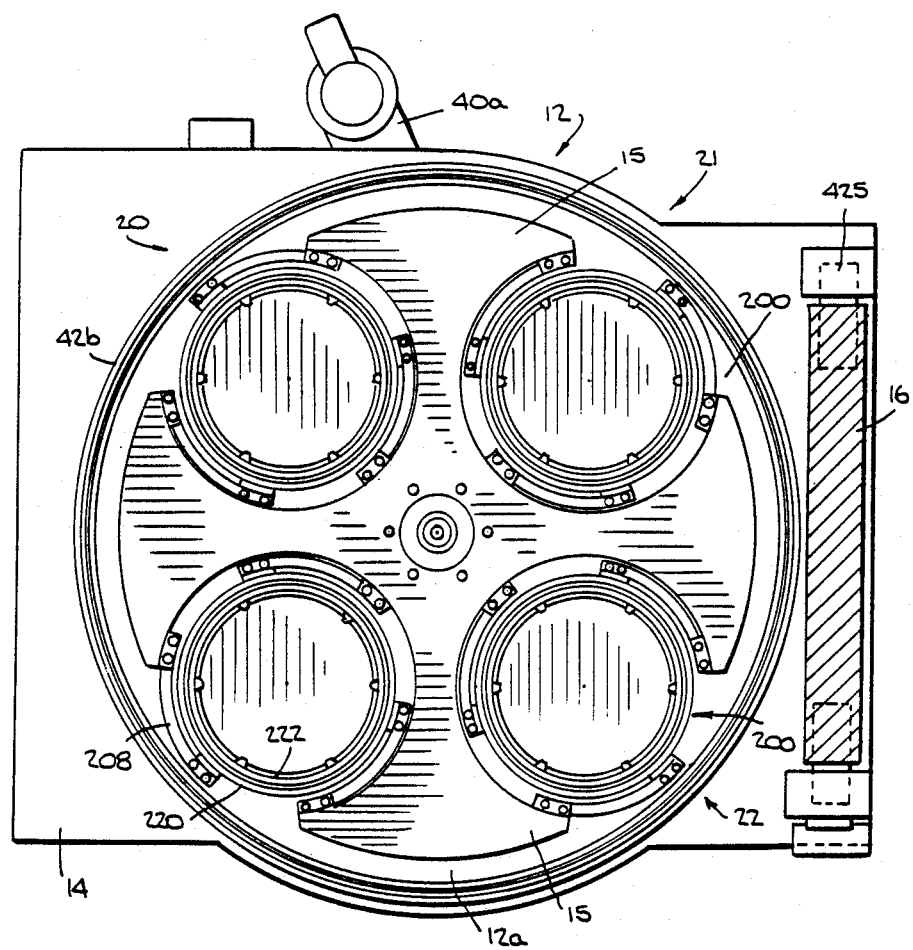
FIG. 26 is a cut away right side view showing the interior of the main processing apparatus according to the invention.
Figure 27:
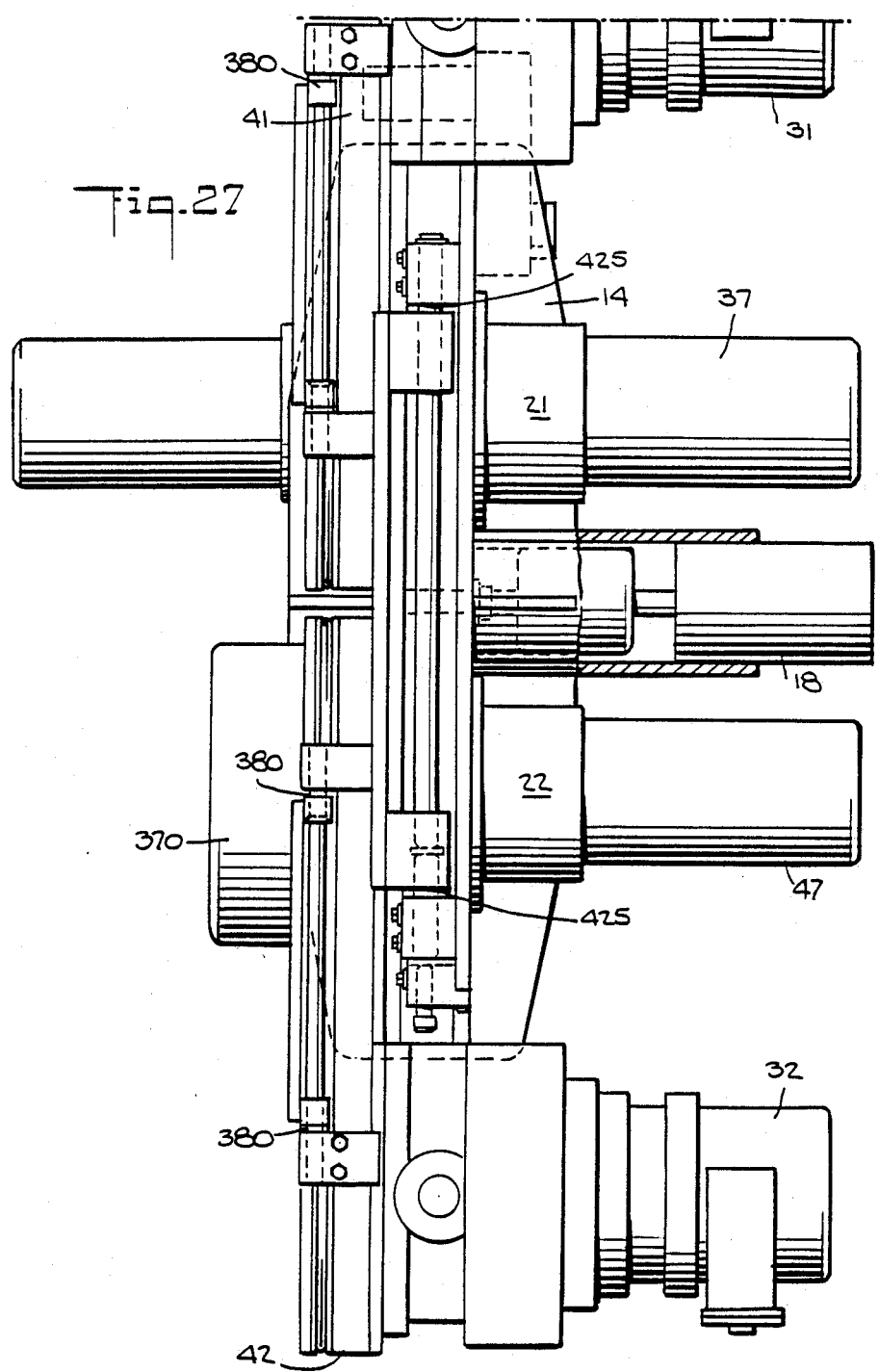
FIG. 27 is a rear view of the apparatus according to the invention.

Each of stations 20, 21, 22 and 23 includes a first section mounted on chamber half 14 and a second opposing portion mounted on chamber half 16. This is shown most clearly when viewed in conjunction with the top views of FIGS. 14 and 15, in the side views of FIGS. 2 and 26 and in the rear view of FIG. 27. As shown in FIGS. 14 and 15, chamber half 14 includes the load-lock door 25 at station 20, shown opened in FIG. 15 and closed in FIG. 14. The rear portion 16 of chamber 12 at station 20 includes a front-plane device 27, the purpose of which will be explained in greater detail below. At station 21, which, in the illustrated embodiment, is an etching station, but may be a sputtering station, e.g., a back-plane device 37 is attached to chamber half 14, and chamber half 16 has attached thereto manifold 41 and pump 31, which overlaps the top of the chamber 12. Back-plane device 37 is similar to front-plane device 27. At station 22, which may comprise a sputtering station, a further back-plane device 47 is provided, which may be disposed directly below the back-plane device 37. This can be seen most clearly in FIGS. 1 and 2. The chamber portion 16 as shown in FIG. 1 and FIG. 25, has mounted thereto manifold 42 and pump 32, which extends below the chamber 12, and which cannot be seen in FIG. 14. At station 23, which also may be a sputtering station like station 22, chamber half 14 comprises a further back-plane device 57 and chamber portion 16 has mounted thereto manifold 43 and associated vacuum pump 33, as shown in FIG. 1 and FIG. 25. Again, vacuum pump 33 is disposed below the chamber 12 via the manifold 43. The two chamber halves 14 and 16 are hinged together at 425 and a locking mechanism, e.g., a screw fastener, is provided at 427. See FIG. 25. At least one seal 426 is provided, e.g., O-ring seals as shown in FIG. 26 for sealing the two chamber halves together. FIG. 16 shows the two chamber halves in the opened position. As shown, the various vacuum pumps and manifolds open together with chamber half 16. Also, as shown in FIG. 18 and 27, each of the manifolds define a door which is hinged at 380, allowing access to the interior of the work station without requiring opening of the main chamber 12.

A manifold 40a is attached to chamber half 14. Manifold 40a allows vacuum from a main cryogenic vacuum pump 40d to be supplied to main chamber volume or plenum 12a and to load-lock station 20, as necessary. Before pump 40d is activated, a mechanical vacuum pump (not shown) is utilized to bring the vacuum down in the plenum 12a or the load lock 20 to a specified vacuum level close to the desired final level. A fitting 33d is provided for this purpose. See FIG. 25. Pump 40d then is used to provide the final desired vacuum level. As will be explained later, manifold 40a includes a valve 40b which allows communication with main volume 12a, and valve 40c which allows communication with the volume defined by the load-lock station 20.

Although not shown in the drawings suitable power supplies for biasing the cathode assemblies of the processing stations and the substrates are also provided. Furthermore, R.F. power supplies may also be provided behind the back-plane devices 37, 47, and 57 for improving step coverage desposition on the substrates.

As shown in the drawing figures, the apparatus includes a wafer receiving section, indicated generally at 70, a wafer alignment, centering and lift means 90, a controlled environment chamber 110 having an intermediate load-lock indicated generally at 120, a transfer arm 140 disposed in chamber 110 for receiving and delivering a wafer from or to the intermediate load-lock 120, and for transferring a wafer to or from a load-lock arm 160, which transfers a wafer, whether processed or unprocessed, to or from the main load-lock station 20 of chamber 12. Receiving station 70 includes a cassette 75 holding a plurality of wafers to be processed and/or wafers which have already been processed by the apparatus of the invention. A pick and place mechanism 80 transfers wafers between cassette 75 and alignment, centering and lift means 90. See FIGS. 2, 3 and 4. Two cassettes 75 and 76 may also be used. See FIG. 4. As indicated, mechanisms 80, 90, 120, 140 and 160 are bi-directional, i.e., unprocessed wafers from section 70 are transferred to chamber 12 by these mechanisms and processed wafers are returned to section 70 by the same mechanisms.

Figure 3:
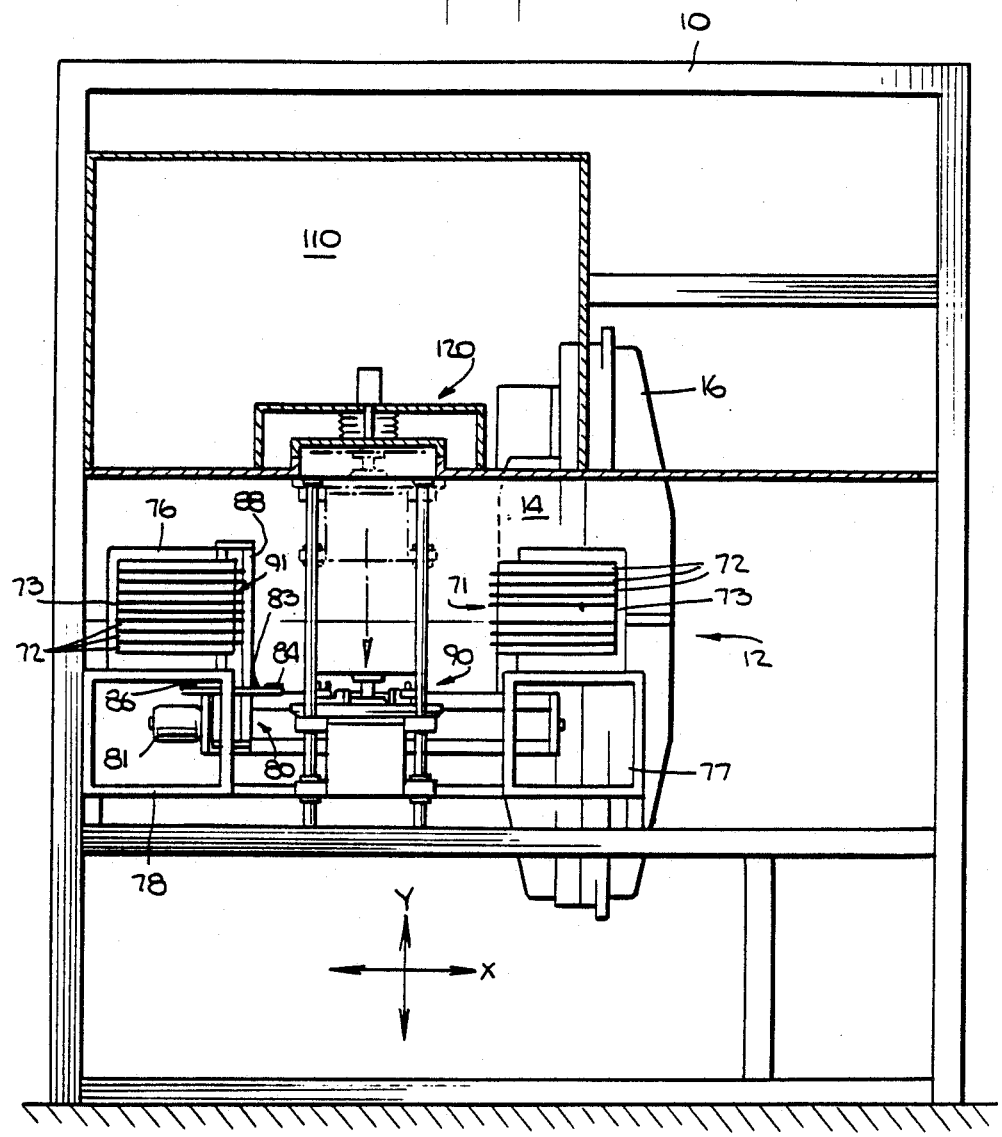
FIG. 3 is a front sectional view of the apparatus of FIG. 1.
Figure 3A:
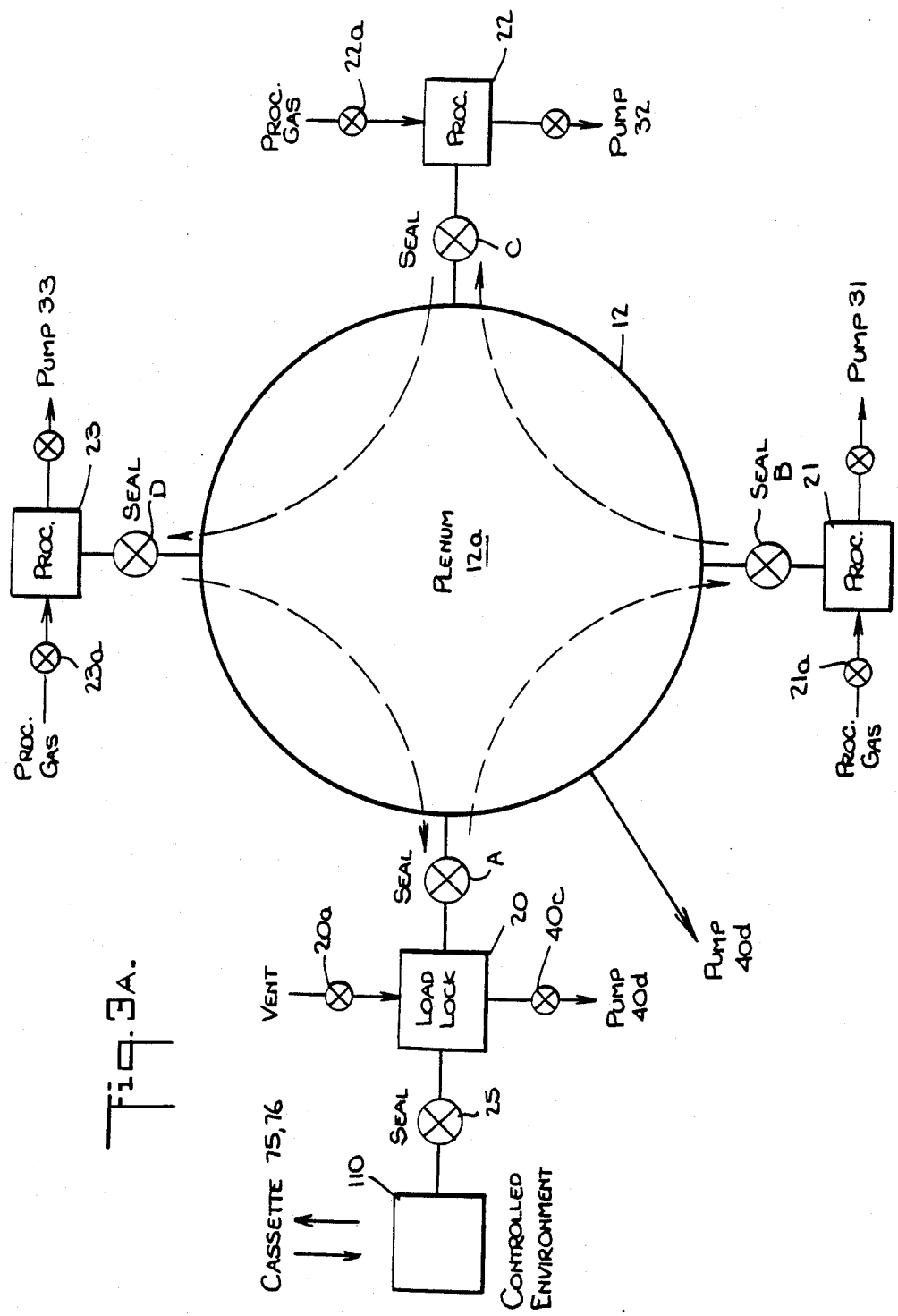
FIG. 3A is a schematic diagram of the apparatus according to the invention.

FIG. 3A is a schematic representation illustrating the overall operation of the apparatus according to the present invention. Substrates to be processed are supplied from one of two cassettes 75 or 76 into the controlled environment 110 via intermediate load-lock 120. The substrate is then transferred into load-lock 20. A sealing member, for example, load-lock door 25, isolates load-lock 20 from the controlled environment. A valve 20a is utilized to vent the load-lock to the controlled environment so that the load-lock door 25 can be opened to the controlled environment 110 to allow the substrate to be received in the load-lock 20. A mechanical pump (not shown) and cryogenic pump 40d are utilized to evacuate the load-lock 20 via suitable valves including valve 40c, once load-lock door 25 is closed. A sealing member A, to be described in greater detail below, seals the load-lock 20 from the plenum 12a, and opens the plenum 12a to the load-lock once the load-lock has been evacuated to the vacuum level existing in the plenum 12a.

As will be explained in greater detail below, the plenum 12a, defined by chamber 12, is utilized to transfer the articles to be processed from one processing chamber to another. The processing chambers are shown at 21, 22 and 23. The plenum 12a itself, however, is not utilized to perform process steps, such as sputtering or etching. Rather, the substrates are transported through the plenum and transferred to at least one of the processing chambers, where the process step is performed. In accordance with the invention, an article to be processed need not be processed serially, as the apparatus of the present invention allows an article to skip a particular process chamber, for example. Assuming that the article is to be processed in all process chambers, however, the article is isolated from plenum 12a via sealing member B and then supplied to process chamber 21. Pump 31 (and associated mechanical vacuum pump) is utilized to evacuate the process chamber 21 and a valve 21a provides process gas to the process chamber 21. If further processing of the article is to occur after processing in process chamber 21, the article may be transferred to process chamber 22 through a sealing member C, as shown. Pump 32 (and associated mechanical vacuum pump) is utilized to evacuate process chamber 22 and process gas is supplied to the process chamber 22 via valve 22a. If further processing is to occur, the article may be transferred to process chamber 23 through a sealing member D. A pump 33 (and associated mechanical vacuum pump) is utilized to evacuate process chamber 23 and process gas is provided to the chamber 23 via valve 23a. In the illustrated embodiment, three process chambers are shown, although more or fewer process chambers could be provided. After the article has been processed in process chamber 23, it is again supplied back to the load-lock 20 via sealing member A. The article is then returned via sealing means 25 to the controlled environment 110 and returned to the cassettes 75 and 76.

Accordingly, the apparatus shown schematically in FIG. 3A allows isolation of each process chamber 21, 22 and 23 from the other process chambers and also from the main plenum 12a. This prevents cross-contamination between processes being performed in the different process chambers. Furthermore, the apparatus shown allows essentially random access to the different process chambers. Therefore, it is not necessary that the article to be processed enter each process chamber. Rather, the article to be processed can skip a process chamber if that particular process is not to be performed on the article. Additionally, the process to be performed in a particular process chamber can be changed without affecting the other process chambers, because of the isolation provided by seals B, C and D which isolate each process chamber from the others and the plenum 12a.

Furthermore, each process chamber 21, 22 and 23 is essentially independent of the other process chambers, having its own pumps, valves, gas inlets and processing means, so that if one processing chamber ceases to function for some reason, the other chambers are not affected. The gas inlets to each process chamber are shown in FIG. 25 at 21a, 22a and 23a.

The structure of sealing members A, B, C and D will be described in greater detail below, and forms an important part of the invention. In the embodiment shown in the drawings, sealing members A, B, C and D comprise sealing ring members and resilient spring means which hold the article in position during processing and also provide the necessary motion and sealing action between the process chamber and the plenum 12a. Although separate sealing members A, B, C and D are shown in FIG. 3A, in an actual embodiment of the device, the same sealing member is used to seal the different process chambers once a substrate enters the plenum 12a, as the sealing members perform not only a sealing function but also hold the substrate in position during its movement in the plenum 12a. More than one substrate, can, of course, be processed in chamber 12 at one time, and accordingly, a plurality of sealing members, one of which is associated with a respective process chamber at a particular point in time, may be provided. This will be explained in greater detail below.

The operation of the invention will now be described in greater detail. With particular reference to FIGS. 3 and 4, the apparatus of the present invention may include one cassette 75 or two cassettes 75 and 76 holding a plurality of stacked wafers 72. Although the cassettes are shown to be substantially horizontal in the drawings, they may have a slight inclination from the horizontal so that the open ends of the cassettes, shown in FIGS. 1 and 3 and identified with reference numeral 71, are slightly raised from closed side 73. In this way, sliding of the wafers in the cassettes 75 or 76 so that they fall out of the open ends 71 is prevented. Cassettes 75 and 76 are mounted on frames 77 and 78, respectively. A pick and place mechanism 80, which is movable in both X and Y axes, shown in FIG. 3 and more clearly in FIG. 4, is provided for retrieving unprocessed wafers from the cassettes and for inserting processed wafers into the cassettes. Pick and place mechanism 80 is driven by a motor 81 and a suitable linkage, for example, along tracks 82. Pick and place mechanism 80 includes a movable arm 83 having suitable grasping mechanisms, e.g., vacuum chucks 84 and 86, disposed at ends of the arm. This is shown more clearly in FIGS. 4 and 5. Arm 83, as shown in FIG. 5, is fastened to a second cross arm 87, which is mounted to member 88, member 88 being slidable in the X direction along tracks 82. Arm 87 is slidable in a track 85 in member 88 in the Y direction. Motor 81 drives via a first screw 91 member 88 and thus arm 87 in the X direction and also via a second screw 91a or other suitable linkage in the Y direction.

Figure 6:
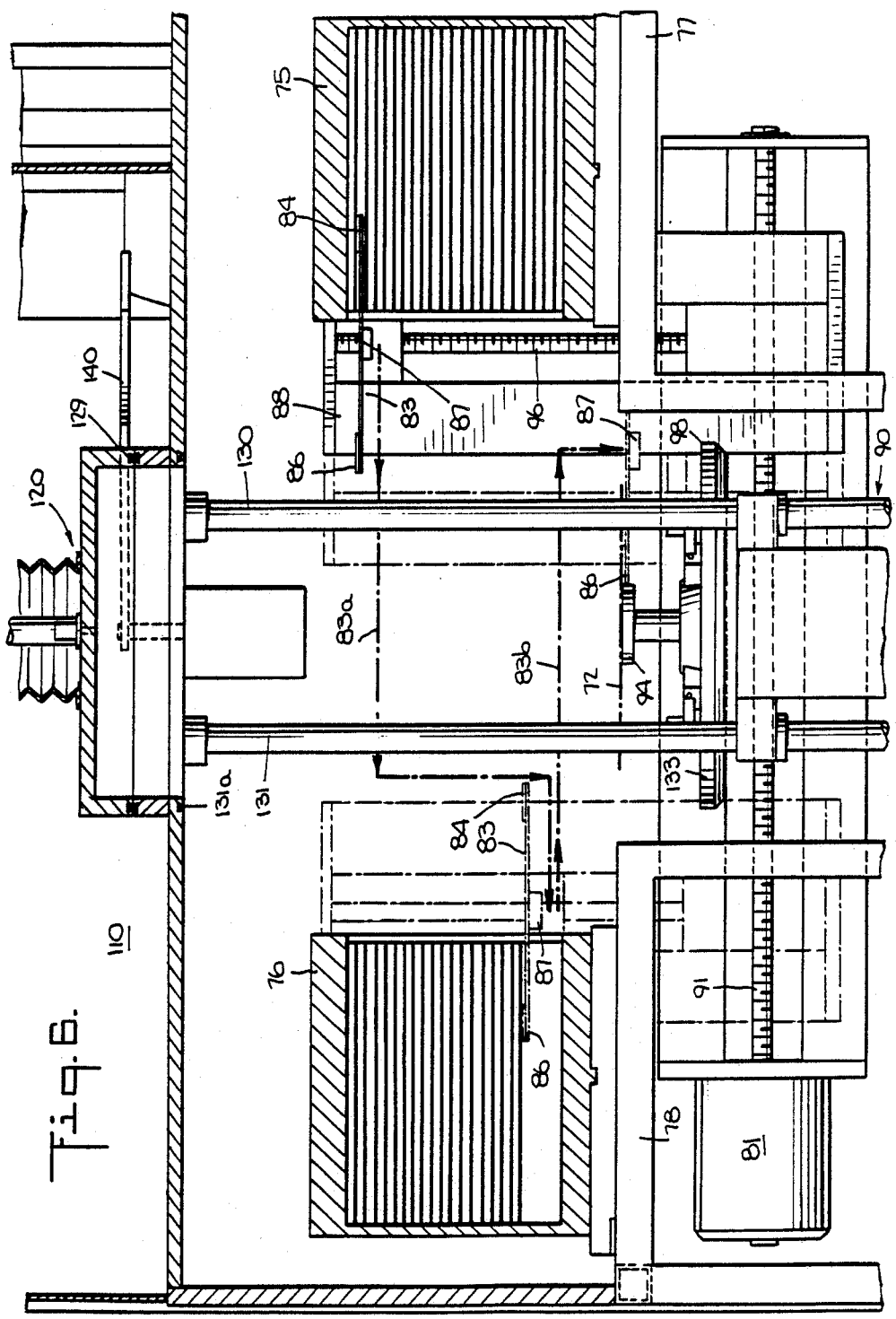
FIG. 6 shows that part of the apparatus shown in FIG. 4 and illustrates some of the steps of wafer handling before the wafer is introduced into a controlled environment of the apparatus.

The sequence of operation of pick and place mechanism 80 is shown in FIGS. 4 through 7. FIG. 4 shows a wafer 72 on alignment and lifting mechanism 90. The wafers may comprise, e.g., 6 or 8 inch silicon semiconductor substrates. Alignment and lifting mechanism 90 includes a vacuum chuck 94. The processed wafer 72 has been removed from chamber 12 of the machine. Pick and place mechanism arm 83 is driven from its prior position, which is shown by the phantom line in FIG. 4 at 92, so that vacuum chuck 84 is just below the lower surface of substrate 72 on vacuum chuck 94. Vacuum chuck 94 at this point is deactivated and vacuum chuck 84 activated, so that wafer 72 is picked up by vacuum chuck 84. Arm 83 is now driven horizontally to the left and then vertically upward and to the right to the position adjacent cassette 75 at which the processed wafer is to be inserted. This is shown by the position of the arm 83 shown in phantom near cassette 75 in FIG. 4. Arm 83 is then driven further in the X direction so as to place the substrate into a slot of the cassette. As an example, the last, or top slot of cassette 75 has been chosen in FIGS. 4 and 6. As shown in FIG. 6, once a processed wafer has been inserted into the last position in cassette 75, arm 83 is driven to the left in the X direction, as shown by the arrow 83a, and then vertically downward to a position adjacent cassette 76 so that an unprocessed wafer can be picked up by vacuum chuck 86. If the last position of cassette 75 had not been reached, arm 87 would have moved upward one position to retrieve the next wafer (unprocessed) in cassette 75. Assuming only processed wafers remain in cassette 75, however, arm 87 traverses to cassette 76 to remove an unprocessed wafer. Each cassette 75 and 76 can at any time contain both processed and unprocessed wafers. It is not necessary that one cassette contain only processed wafers and the other cassette unprocessed wafers.

Assuming that a processed wafer has been placed in the uppermost position of cassette 75, the arm 83 will travel to the left in FIG. 6 as shown, and then vertically downward to a position adjacent the sixth position from the bottom of cassette 76. (Assuming five wafers have already been removed from cassette 76 and are now in chamber 12 and on load-lock arm 160—to be explained in greater detail later.) Accordingly, arm 83 moves so that vacuum chuck 86 enters the cassette 76 to remove an unprocessed wafer therefrom. Arm 83 then moves in the X direction to the right as shown by the arrow 83b, and then moves downwardly in the vertical direction to a position adjacent the right side of the vacuum chuck 94. Vacuum chuck 94 is now activated and vacuum chuck 86 deactivated. Accordingly, wafer 72 is left in the position shown by the dotted lines on top of vacuum chuck 94. Arm 83 then moves to the right to the home position 83c shown in FIG. 7, so it is out of the way of vacuum chuck 94.

As shown in FIG. 8, a wafer 72 may be placed on vacuum chuck 94 slightly off center from the center 95 of vacuum chuck 94. It is necessary to align the center of the substrate with the center 95 of vacuum chuck 94. Accordingly, lifting table 90 includes an aligning means comprising four radially disposed movable members 102 mounted on support 98. Radially disposed members 102 include aligning pins 109. When it is necessary to align substrate 72, vacuum chuck 94 moves vertically downward, as shown in FIG. 7. At the same time, vacuum is removed from vacuum chuck 94 and radially disposed members 102 move radially inwardly, as shown in FIG. 9, thus biasing pins 109 against wafer 72 and aligning wafer 72 with the center axis of vacuum chuck 94. The movable members 102 may be guided radially on guide rods 114 or by any other suitable operating mechanism. Wafer 72 may also include an indexing mark or flat spot, for example, flat spot 111. It may be necessary to align the flat spot properly on vacuum chuck 94 so that the wafer is properly inserted into chamber 12. Accordingly, vacuum chuck 94 holding wafer 72 is rotated as shown by arrow 112. Proper orientation of the index mark 111 may be determined by a light source and light sensor, for example, a light source 113 (See FIG. 13) disposed near the intermediate load-lock 120 and a light sensor 113a disposed on support 98. Other indexing marks can be used instead of a flat spot, for example, a small notch in the substrate 72.

Once the substrate has been centered and aligned, support 98 is driven along guide rails 130 and 131 vertically by a suitable actuating means 132, as shown by the phantom lines in FIG. 7. Substrate 72 is raised into a recess 122 disposed in a housing 124 defining chamber 110 for maintaining a controlled environment therein. Housing 124 includes an aperture therein defined by an upstanding circular wall 126. A top seal cover 128 is movable in the vertical direction, and when in contact with upstanding wall 126, seals controlled environment chamber 110 from the outside via O-ring seals 129. Lift table support 98 includes a sealing surface 133 which seals via O-ring seal 131a with housing 124 when it engages housing 124. The operation of the load-lock thus formed is shown more clearly in FIGS. 10 and 11.

Figure 10:
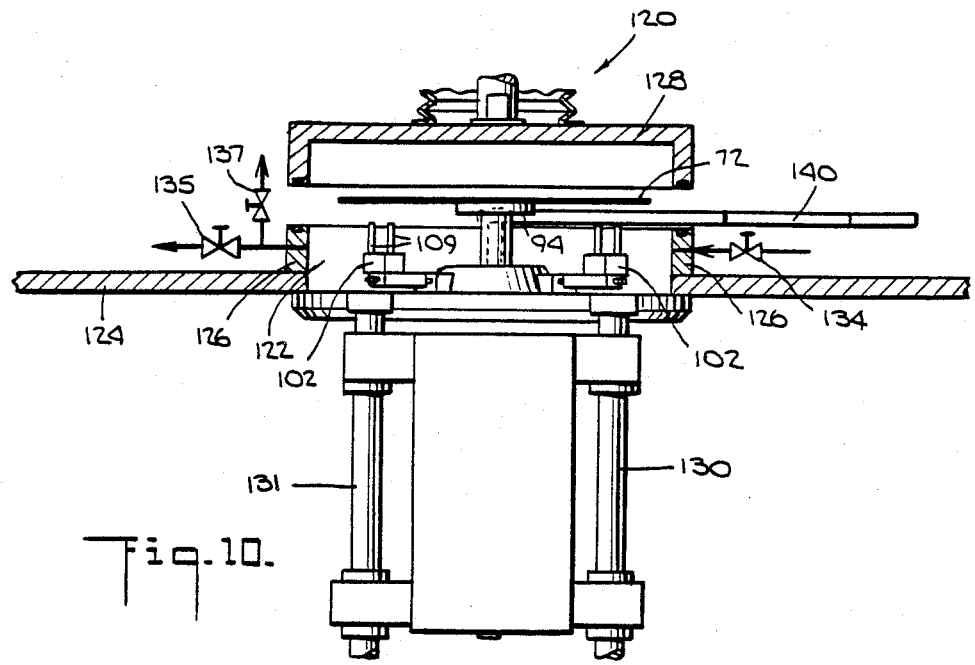
FIGS. 10 and 11 are sectional views showing parts of the apparatus for transferring a wafer into and out of a controlled environment chamber, and different steps performed by such apparatus.
Figure 11:
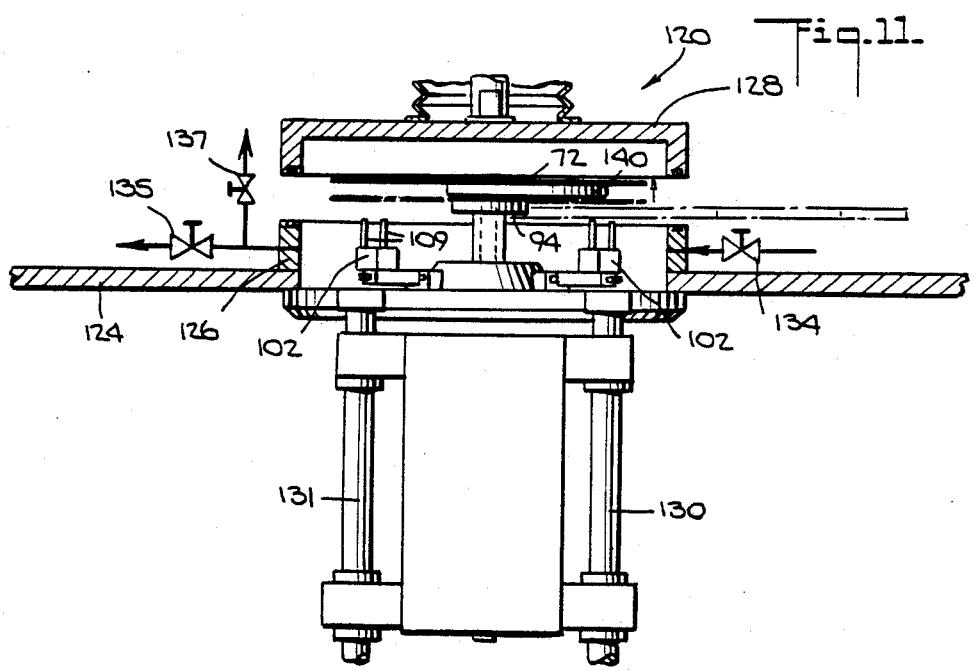
Figure 12:
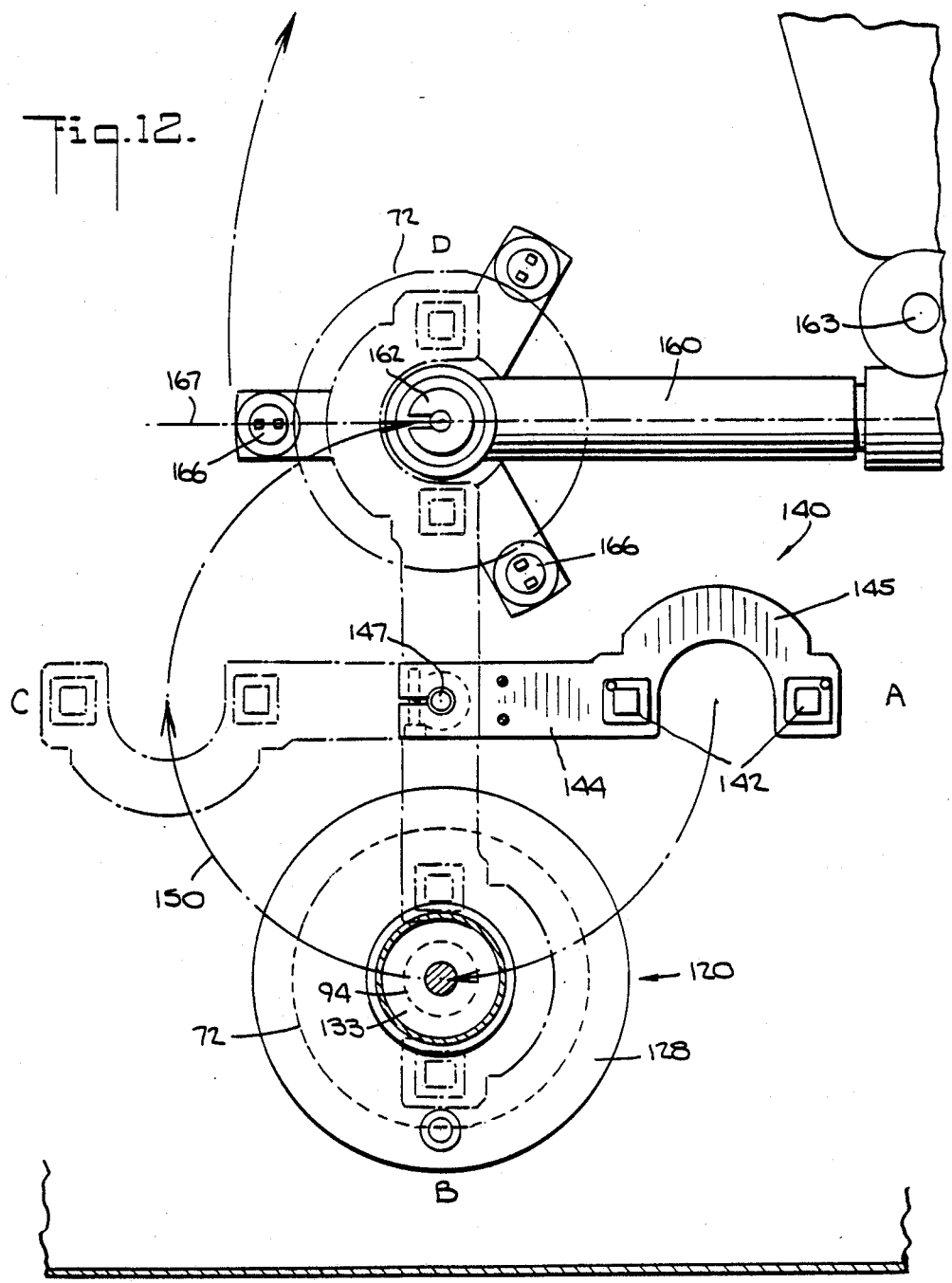
FIG. 12 shows a top view of a portion of the apparatus for handling the wafer in the controlled environment prior to or after processing of the wafer in the main chamber volume.

As shown in FIG. 10, the intermediate load-lock 120 is provided in order to maintain the purity of the atmosphere in the controlled environment 110, which essentially may comprise an environment of dry nitrogen gas, as it is desired to prevent as much water vapor and other contaminants as possible from being introduced into the main chamber 12. Accordingly, prior to removing top seal 128, which is movable in a vertical direction as shown, nitrogen gas is introduced via a valve 134 into the volume 122. At the same time, a valve 135 is opened thereby to remove the existing atmosphere in chamber 122. Once dry nitrogen gas has been introduced into chamber 122 for a sufficient period of time and the existing atmosphere has been purged, it is necessary to adjust the pressure in chamber 122 so that it approximates the pressure in the controlled environment 110. Accordingly, a bleed valve 137 is activated to allow the pressure in controlled environment 110 to equalize substantially with the pressure in chamber 122. Once the pressure has equalized, top seal 128 is opened, as shown in FIG. 10, and transfer arm 140, which is shown in greater detail in FIG. 12, enters the opened chamber 122 and vacuum chucks 142 disposed on the transfer arm 140 end section 145 engage the wafer 72 for removing the wafer from chamber 122. See FIGS. 11 and 12. In FIGS. 11 and 12, transfer arm 140 is shown engaging wafer 72. Transfer arm 140 enters chamber 122 slightly below the level of wafer 72, and once in position, moves vertically upward so that vacuum chucks 142 engage wafer 72 and remove it from vacuum chuck 94. Alternatively, vacuum chuck 94 may be allowed to lower instead, thus dropping wafer 72 onto transfer arm 140.

FIG. 12 shows the operation of transfer arm 140 in greater detail. FIG. 12 is a top view of the transfer arm 140 and load-lock arm 160. Transfer arm 140 is pivotably mounted as shown at 147 and driven by a motor 143. See FIG. 13. Top seal cover 128 and the mechanism 133 for operating the top seal cover, which may comprise a hydraulic cylinder or other activating device, are shown. See also FIGS. 1, 2 and 13. Transfer arm 140 includes a straight section 144 and a crescent-shaped section 145 having disposed thereon vacuum chucks 142. Vacuum chucks 142 may comprise a recessed groove having a square configuration leading to a vacuum source, as shown. The purpose of transfer arm 140 is to receive unprocessed wafers from vacuum chuck 94 and deliver them to load-lock arm 160 and conversely, to receive processed wafers from load-lock arm 160 and deliver them to vacuum chuck 94. The purpose of load-lock arm 160 is to supply wafers to be processed to the load-lock station 20 of chamber 12 and to retrieve processed wafers from load-lock station 20 and deliver them to a position whereby transfer arm 140 can retrieve them to return them to vacuum chuck 94, which then eventually returns them to cassettes 75 and 76 via arm 83. Load-lock arm 160 is rotatable about pivot point 163 in the plane of FIGS. 14 and 15 and also about an axis 167 as shown.

Figure 15A:
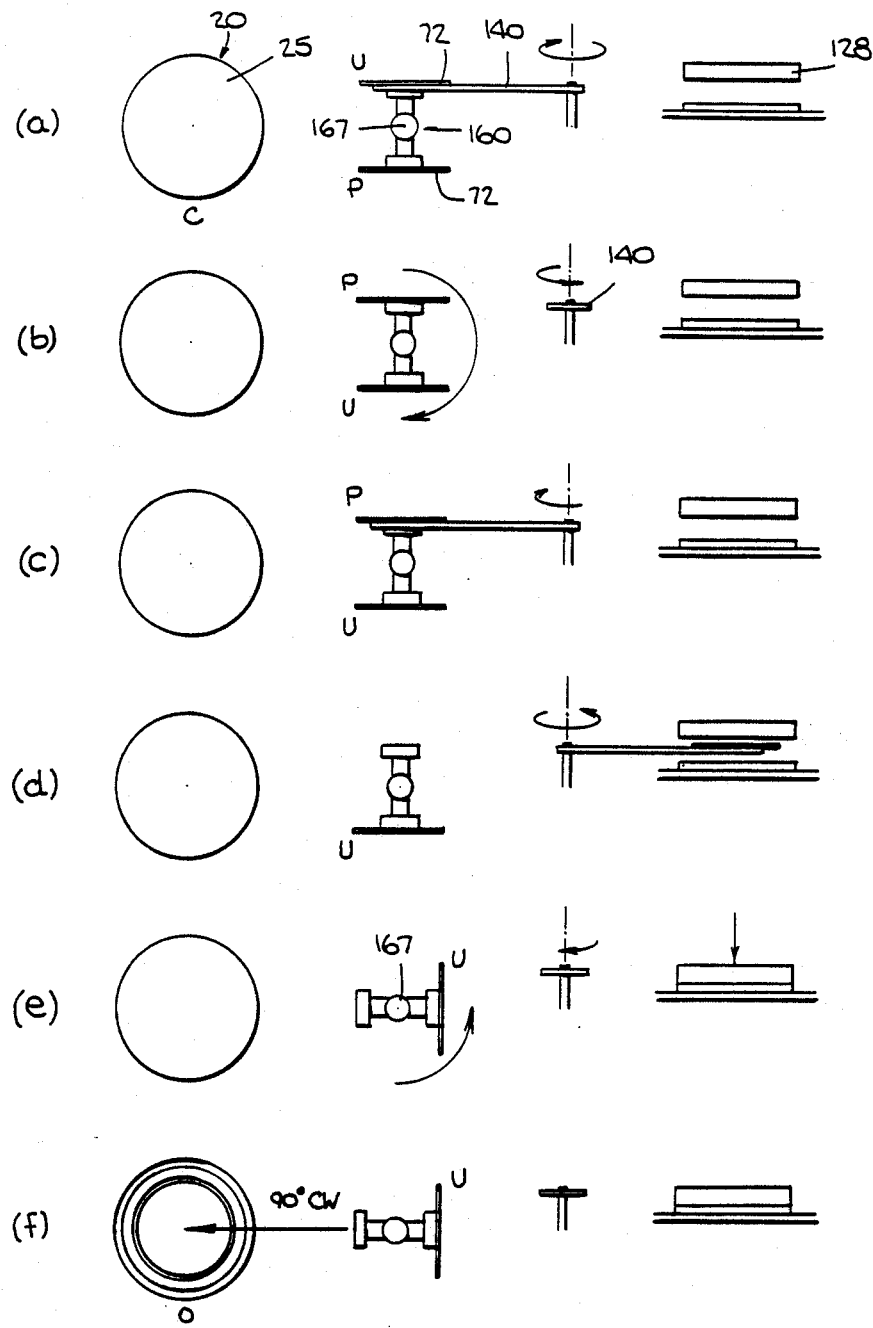
FIGS. 15A and 15B show schematically the steps involved in transferring a wafer to and from the wafer processing apparatus proper.
Figure 15B:
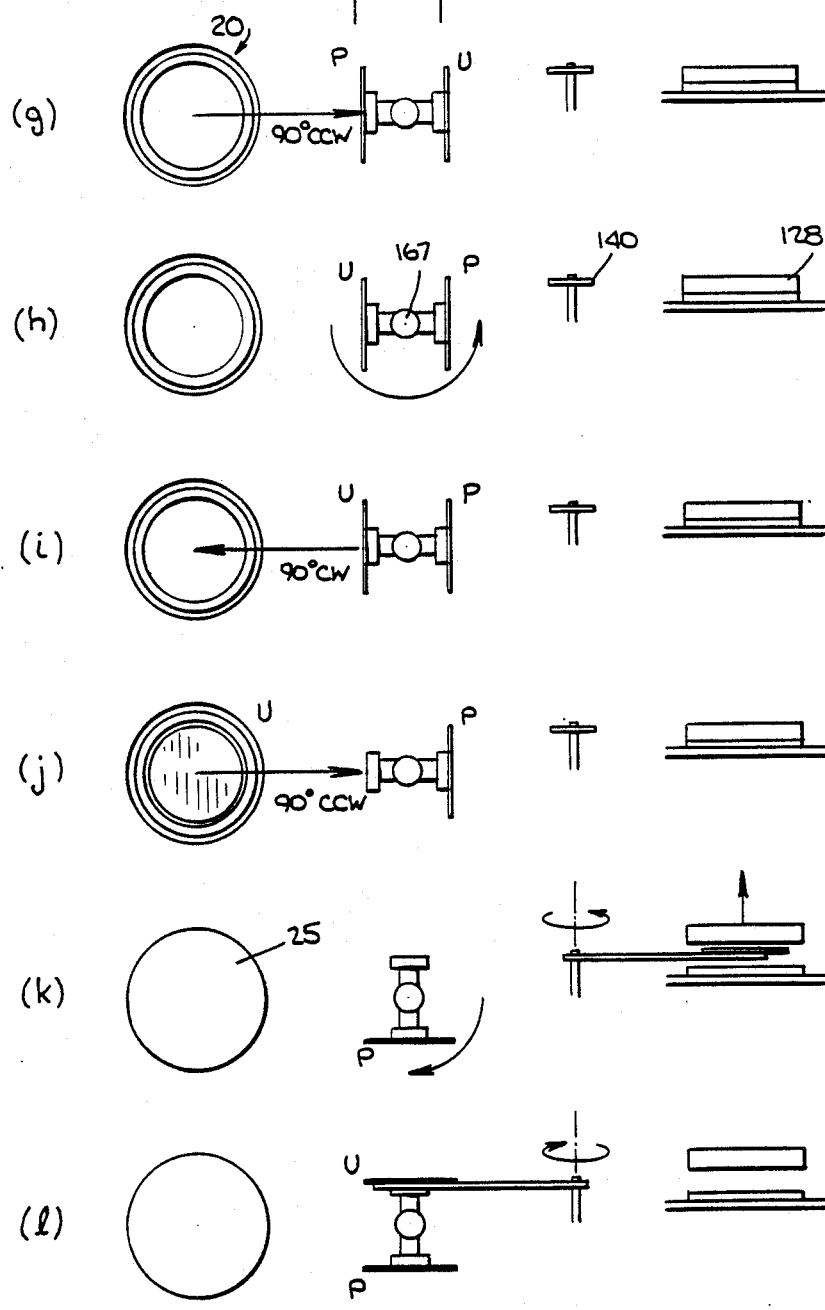
Figure 16:
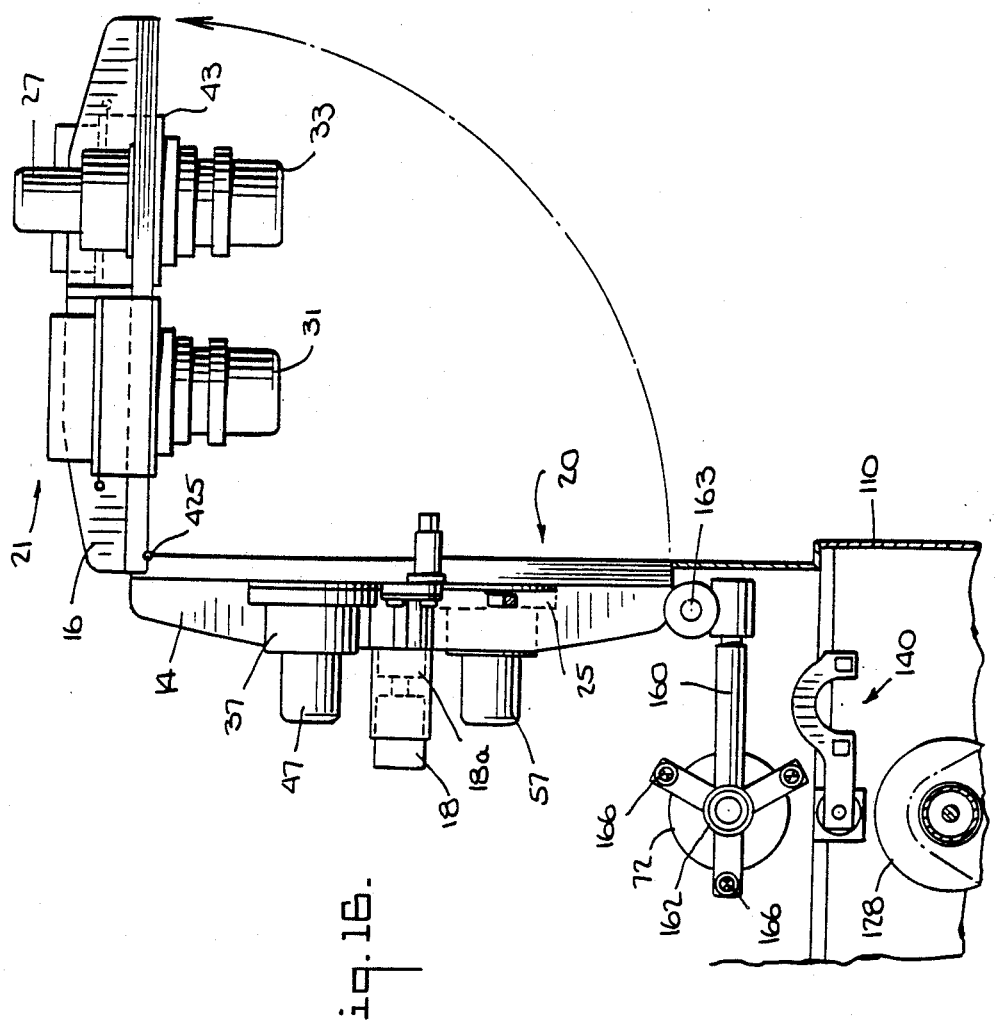
FIG. 16 is a top view of the apparatus according to the invention showing the main processing apparatus in its opened condition.

With reference to FIGS. 15A and 15B, the operation of transfer arm 140 and load-lock arm 160 will now be explained. FIGS. 15A and 15B are a schematic illustration of the positions of load-lock 20, load-lock arm 160, transfer arm 140 and intermediate load-lock top seal 128 during a complete machine cycle. In FIGS. 15A and 15B, "O" designates "open", "C∞ designates "closed," "U" designates "unprocessed" and "P" designates "processed." With reference to FIGS. 12, 14, 15A and 15B, the operation is as follows. Transfer arm 140 moves from the position shown in FIG. 14 at A to the position shown at B in FIG. 14, at which it receives a new wafer from vacuum chuck 94. Top seal 128 is open at this time as shown in FIG. 15A(a). Transfer arm 140 continues along the arcuate path defined by the arrows 141 to position C as shown in FIG. 14 and eventually places an unprocessed wafer upon the upper vacuum chuck 162 of load-lock arm 160 at point D. This is shown in FIG. 15A(a). At this point load-lock 20 is closed and transfer arm 140 moves to point C in FIG. 14. Load-lock arm 160 as shown in FIG. 15A(b) now rotates 180° about axis 167, thus placing the unprocessed wafer at the bottom and the processed wafer which has already been removed from the load-lock 20 on top. Transfer arm 140 returns to position D shown in FIG. 14 and the processed wafer is now removed by transfer arm 140 as shown in FIG. 15A(c), and returned to the intermediate load-lock 120 as shown at FIG. 15A(d), whereby the processed wafer is returned to one of the cassettes 75 or 76. The next step, as shown in FIG. 15A(e), is the rotation of load-lock arm 160 90° about axis 167 so that the unprocessed wafer faces away from the load-lock 20. Load-lock 20 now opens as shown in FIG. 15A(f), and load-lock arm 160 rotates about pivot 163 90° clockwise so that the empty vacuum chuck of load-lock arm 160 facing load-lock 20 can retrieve a processed wafer from load-lock 20. Once a processed wafer has been engaged by the load-lock arm 160, load-lock arm 160 pivots counterclockwise 90° as shown in FIG. 15A(g). Accordingly, a processed wafer and an unprocessed wafer are now disposed upon the two vacuum chucks of load-lock arm 160 as shown in FIG. 15A(g). Load-lock arm 160 now rotates 180° about axis 167 as shown in FIG. 15B(h), so that the unprocessed wafer faces the load-lock 20. Load-lock arm 160 now rotates 90° about pivot 163, and the unprocessed wafer which had been placed on the load-lock arm 160 in step 15A(a), is now inserted into load-lock 20 when load-lock arm 160 pivots 90° clockwise around point 163. This is shown at step 15B(i). Load-lock arm 160 pivots about pivot point 163 90° counterclockwise as shown at step 15B(j), and then rotates 90° about pivot point 167 as shown at 15B(k), so that the processed wafer now face downward. Load-lock 20 is closed at this time, and processing of the wafer inserted into chamber 12 at step 15B(i) has begun. Transfer arm 140 has, in the meantime, engaged a new unprocessed wafer as shown at step 15B(k), and the unprocessed wafer is deposited upon the upper vacuum chuck of load-lock arm 160 as shown at 15B(l), returning the apparatus to the beginning of the cycle, which is the same as that shown in FIG. 15A(a).

Accordingly, load-lock arm 160 provides an efficient and versatile way of transferring wafers between transfer arm 140 and load-lock 20. The rotation of arm 160 about axes 163 and 167 and the provision of two vacuum chucks 162 allow one mechanism, in a minimum amount of time and space, to handle both processed and unprocessed wafers.

Figure 2:
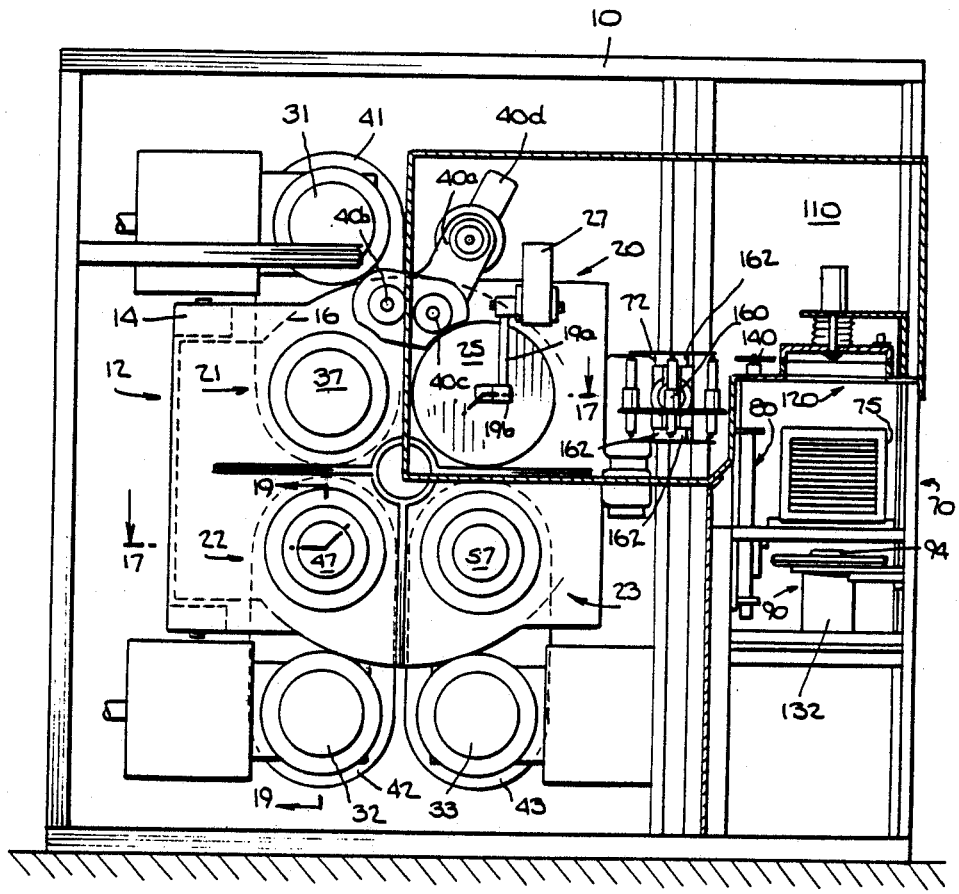
FIG. 2 is a left side partially sectional view of the apparatus of FIG. 1.
Figure 17:
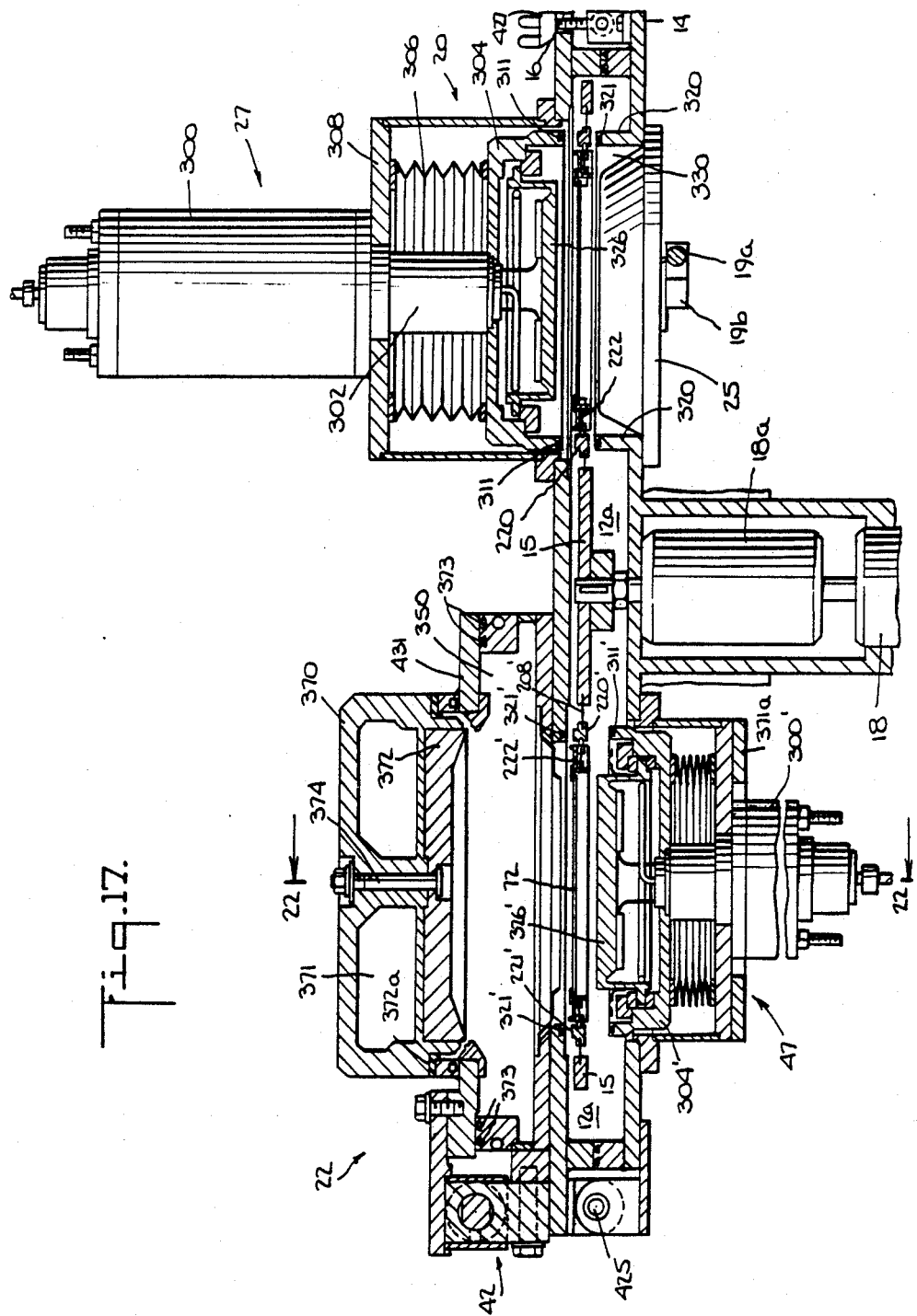
FIG. 17 is a horizontal sectional top view through the main processing apparatus of the invention taken through section lines 17—17 of FIG. 2.
Figure 28:
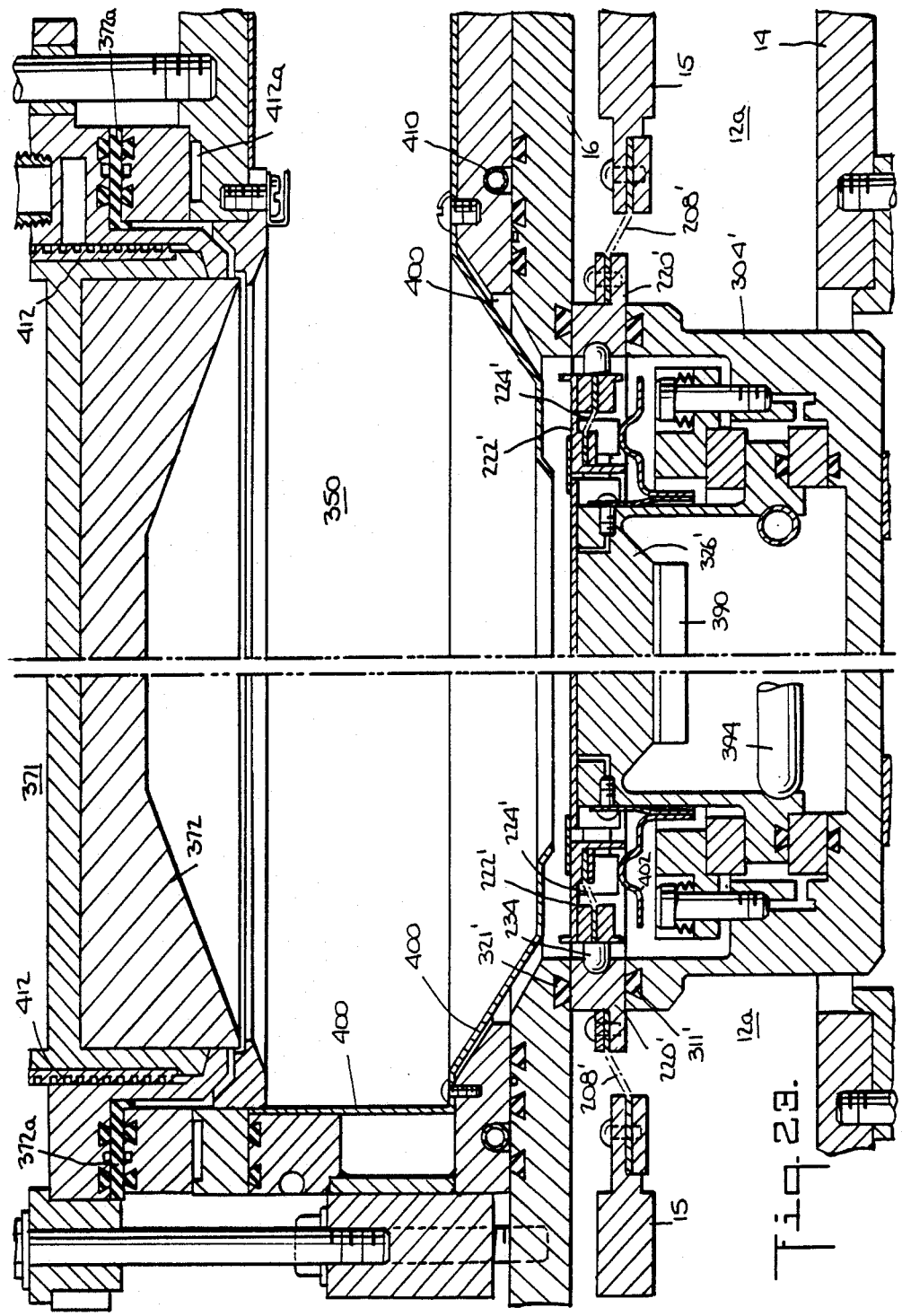

FIG. 17 is a top sectional view of the apparatus through section lines 17—17 of FIG. 2. As shown, a section is taken through both the load-lock station 20 and a sputtering station 22. Load-lock station 20 includes a front-plane device generally indicated at 27 and sputtering station 22 includes a back-plane device generally indicated at 47 and which is similar to front-plane device 27. Chamber 12 defined by chamber halves 14 and 16 includes index plate generally indicated at 15 which is shown in greater detail in FIG. 26. Index plate 15, as shown in FIG. 26, is driven by motor 18 and has four positions, each of which is provided with a substrate holding device as shown in greater detail in FIG. 24.

Figure 24:
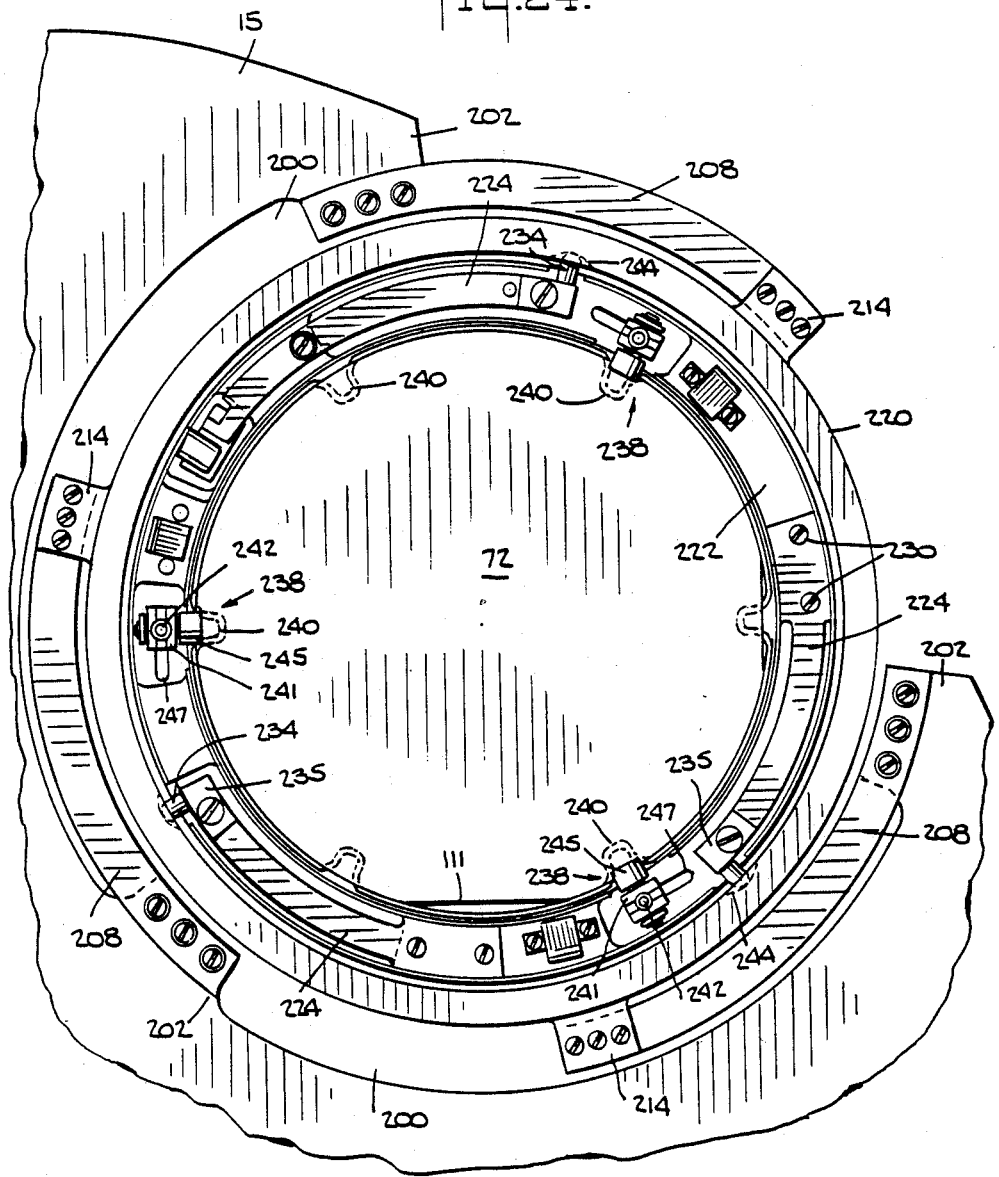
FIG. 24 is a front view of the means for holding a wafer in a rotatable index plate of the main processing apparatus of the invention.

Before describing the operation of the apparatus with reference to FIGS. 17 through 23, the substrate holding device of FIG. 24 will be described. The substrate holding device forms part of the sealing members A, B, C and D discussed with reference to FIG. 3A, the operation of which will be described in detail below. A portion of the index plate 15 is shown in FIG. 24. Index plate 15 includes four circular cutouts 200 (See FIG. 26), of which one is shown in FIG. 24. A plurality of tabs 202, illustratively three, are provided which extend into the cutout 200. A plurality of arc-shaped flat springs 208, illustratively three, are attached to respective ones of the tabs 202. At the end of the springs 208 farthest from tabs 202, an attachment is made to tabs 214 which extend from an outer ring-shaped sealing member 220. A further inner ring-shaped member 222 is disposed concentrically inside ring-shaped member 220. Ring-shaped member 222 is removably insertable into ring-shaped member 220, and includes a plurality of further spaced arcuate flat springs 224 attached to the ring-shaped member 222 via screws, for example, as shown at 230. At the other ends of springs 224, spring detent members 234, mounted in blocks 235, are disposed. The detent members engage with recesses 244 in outer ring-shaped member 220 and allow ring-shaped member 222 to be decoupled from ring-shaped member 220. Detent member 234 is made of an insulating material such as ceramic or a high temperature plastic material so that the ring 222 and substrate 72 can be insulated from the remainder of the apparatus. This allows the substrate 72 to be properly biased, for example, for sputtering and etching operations.

Outer ring-shaped member 220 can move perpendicularly to the plane of the index plate 15 with respect to index plate 15, and inner ring-shaped member 222 can move perpendicularly with respect to outer ring-shaped member 220 due to the respective springs 208 and 224. The operation of springs 208 and 224 will be explained in greater detail below. Ring 222 has mounted on the backside thereof tabs 240, which tabs provide a backrest for a substrate 72 held by ring 222. Ring 222 also includes a plurality of substrate securing devices 238, which are engaged by rotatable locking and unlocking devices 166 which are mounted on load-lock arm 160.

As shown in further detail in FIGS. 20 and 21, securing devices 238 include a roughly channel-shaped member 241 having a slot 241a and a central aperture therein for receiving a screw or other fastener 242. Attached to the channel-shaped member 241 is a retaining member 245, which can be rotated so that it extends into the area occupied by the peripheral edge of substrate 72 once it is positioned inside inner ring 222. Channel-shaped member 241 is fastened in a slot 247, the slot being provided for adjustment of the position of member 241. Channel-shaped member 241 is pivotably mounted on fastener 242. The channel 241a in channel-shape member 241 is engaged by a pair of longitudinally extending rods 168 extending from locking and unlocking device 166. Locking and unlocking device 166 may comprise, for example, a small servo motor 170 or air or hydraulically actuated member. As shown, locking and unlocking device 166 includes rod members 168 at both ends thereof, since load-lock arm 160 is provided with two opposed vacuum chucks 162. As shown in FIGS. 20 and 24, channel-shaped member 241 is disposed so that the slot 241a in the member is generally aligned tangentially with inner ring 222 when substrate 72 is clamped in place. Accordingly, member 245 is disposed so that it extends over the edge of the substrate 72 and substrate 72 is firmly held between tabs 240 of ring 222 and members 245. When the load-lock arm 160 is to remove a substrate from the load-lock station 20, vacuum chuck 162 approaches the substrate 72. At the same time, unlocking device 166 approaches channel-shaped member 241 so that the rods 168 are in alignment with the slot 241a in channel-shaped member 241. As vacuum chuck 162 engages the substrate 72, the rods 168 of locking and unlocking device 166 engage with the slot 241a in channel-shaped member 241. Once vacuum chuck 162 has engaged wafer 72 and rods 168 are engaged in the slot 241a in channel member 241, servo mechanism 170 is actuated to rotate rods 168 90°, as shown in FIG. 21. In this way, member 245 slides in an arcuate path so that it is no longer disposed over the edge of substrate 72. In the illustrated embodiment, three securing members 238 are provided spaced equidistantly around ring member 222, and accordingly, three locking and unlocking members 166 are provided. Therefore, all three members 245 are rotated out of the way at the same time. Accordingly, substrate 72 can be removed by vacuum chuck 162.

When a substrate 72 is being placed in chamber 12, locking and unlocking members 166 rotate members 245 in the opposite direction so as to secure the wafer to the ring-shaped member 222.

Vacuum chuck 162 is illustrative of the vacuum chucks generally used throughout the apparatus of the invention. Generally, vacuum chucks 162 are supplied via vacuum supply lines 260. The face of the vacuum chuck includes an annular depression 262 and at least one lead-in line 264 to depression 262 from a central aperture 266. As shown in FIG. 21, load-lock arm 160 is rotatably disposed on a shaft 268, so that either one of the vacuum chucks 162 can enter the load-lock station 20 as discussed with respect to FIGS. 15A and B.

Preferably, vacuum chuck 162 comprises a first member 162a which engages the substrate 72 and a second inner member 162b. Members 162a and 162b are coupled via a flat spring member 162c which allows member 162a to move transversely to member 162b, thus allowing member 162a to conform to the plane of the substrate being engaged.

With reference now to FIGS. 17 and 18, FIG. 17 shows load-lock station 20 to the right with load-lock door 25 closed. FIG. 18 shows load-lock door 25 in the open position. FIGS. 17 and 18 show index plate 15 rotatably mounted in chamber 12 defined by chamber halves 14 and 16. As shown in FIGS. 17 and 18, frontplane device 27 at load-lock station 20 may comprise a motor or hydraulically or air actuated member 300 mounted to support 308. The shaft 302 of member 300 is mounted to a first sealing member 47'. Sealing member 47' preferably comprises a cup-shaped member 304 and a bellows 306 may be provided to protect shaft 302 extending between support member 308 and cup-shaped member 304 and also to provide sealing. Cup-shaped member 304 includes a first sealing surface disposed annularly around the rim thereof, and may comprise, e.g., an O-ring seal 311. Seal 311 of member 304 engages with a machined surface of outer ring-shaped member 220. Both surfaces of outer ring-shaped member 220 are machined so as to provide a sealing surface, and the other surface of ring-shaped member 220 engages with a sealing surface of an annular extending portion 320 of chamber half 14. An O-ring seal 321 may be provided on portion 320. As will be explained in greater detail later, the O-ring seals 311 and 321 are provided for maintaining the environment in the load-lock station 20 area 330 or the chambers of each of the other processing stations 21, 22, or 23 isolated from main chamber volume 12a. Coupled to an inner portion of cup-shaped member 304 is a support member 326 which is movable along with cup-shaped member 304 to provide support for substrate 72. Because substrate 72 is held firmly by ring-shaped member 222 which is attached to ring-shaped member 220 via flat springs 224, substrate 72 can move transversely to the plane in which it is disposed by a small amount without damage when member 326 moves toward substrate 72. Although member 326 may be arranged so that it contacts substrate 72, in the preferred embodiment, member 326 only comes into close proximity with substrate 72. At the load-lock station 20, front-plane member 326 is provided with heat sources for heating the entering substrate 72, shown in FIG. 18. This may be performed by suitable electric heaters 390. Vacuum chucks 162 of load-lock arm 160 can then move in once load-lock door 25 has been opened, to engage or release a substrate and to lock or unlock securing members 238 and thus secure or release substrate 72.

With respect to FIGS. 1 and 2, load-lock door 25 is actuated by a suitable mechanism 19 via a shaft 19a pivotably mounted to the door 25 at 19b. Mechanism 19 may comprise, e.g., a motor driven gear rack or a suitable air or hydraulic cylinder.

As shown in FIGS. 17 and 18, the apparatus of the present invention isolates main chamber volume 12a from the area 330 defining the load-lock. Accordingly, once chamber 330 has been isolated from main chamber 12, as shown in FIG. 18, the atmosphere in chamber 330 may be purged via a valve member (not shown), and the pressure in chamber 330 equalized with that of the controlled environment 110 existing on the other side of the load-lock door. Once the pressures have been equalized, the load-lock door can be opened, and vacuum chuck 162 of load-lock arm 160 can enter the load-lock area 330 to pick up or release the substrate 72, depending upon whether a processed substrate is being removed or an unprocessed substrate inserted. This is shown in FIG. 18. As shown in FIG. 18, springs 208 which couple index plate 15 and outer ring 220, allow ring-shaped member 220 and thus the inner ring 222 and substrate 72 itself to move outwardly toward the load-lock door 25 so that the mentioned sealing of the area 330 defined by the cup-shaped member 304, ring-shaped member 220 and extending member 320 of chamber half 14 can be accomplished.

After a substrate 72 is inserted into area 330 of load-lock 20, load-lock door 25 is closed and the area 330 pumped by a mechanical vacuum pump (not shown) and then by vacuum pump 40d. The vacuum level is equalized with the level in volume 12a and then front-plane cup-shaped member 304 moves away from ring-shaped member 220 to allow communication between volumes 12a and 330.

Similar sealing means are employed at each of the other stations 21, 22 and 23 to isolate the main chamber volume 12a from the volume defining the particular station. In FIGS. 17 and 18, like components have been provided with like reference symbols for station 20 and station 22, with the exception that the reference numerals for like already introduced elements of station 22 are provided with primes. For example, as shown in FIG. 17 or 18, which are top sectional views taken through the load-lock station 20 and the sputtering station 22 (shown to the left), as shown by section lines 17 in FIG. 2, the volume 12a is isolated by the seal provided by members 304', 220' and the wall of chamber half 16 and associated seals 311' and 321'. Station 22 as shown in FIGS. 17 and 18, also includes a back-plane device 47, which is similar to front-plane device 27. Stations 21 and 23 include similar devices 37 and 57. Generally, element 326' is moved toward substrate 72 held by inner retaining ring 222' which is disposed in outer ring 220' via flat springs 224' and detents 234', the outer ring being fixed to index plate 15 via flat springs 208' and being engaged by sealing member 304'. Since station 22 may be a sputtering station, station 22 may include a removable cathode support member and cover 370 mounted to manifold 42, to which a target block 372 is affixed via a bolt 374, for example. Other suitable affixing means are shown in copending application Serial No. 07/095,100, assigned to the assignee of this application. Target block 372 comprises a usable, expendable material, for example, if aluminum is being deposited onto substrate 72, the target block 372 will comprise a block of aluminum. Designs for target 372 and the cathode area generally are disclosed more fully in copending application Serial Nos. 07/095,100 and 07/095,560, assigned to the assignee of this application, and reference is made thereto for details. As shown in FIG. 18, cathode support member 370 is attached to a door 431 and is hinged at 380 to a support structure 381 coupled to chamber half 16. O-ring seals 373 are provided for sealing manifold 42 to chamber half 16. Accordingly, access can be obtained to the interior of manifold 42 and to the cathode and target assembly, as necessary, without disturbing any other processing stations.

Suitable voltages are applied to target 372 with respect to chamber 12, and target 372 is suitably insulated therefrom by insulator 372a. Additionally, magnetic field generating means for appropriately containing the sputtered plasma in chamber 350 and for providing efficient and uniform deposition on substrate 72 may be provided in area 371 and also near the substrate itself, and reference is made to the above copending applications for details. Furthermore, as already indicated, the substrate 72 may be biased at some suitable voltage, and support ring 222 or 222' is insulated from the rest of the apparatus by insulating detents 234.

For process uniformity, for example, for uniform step coverage, an electromagnetic or magnet assembly 371a may be provided on the back-plane members of sputtering stations 22 and 23, as shown. The purpose of assembly 371a is to provide substantially uniform ion current density near the substrate 72. Reference should be made to the above identified copending application Serial No. 07/095,560 for details.

As shown in FIG. 18, back-plane device 47 operates to displace member 326' so that it engages substrate 72 mounted in support ring 222'. Since support ring 222' is resiliently mounted due to the flat springs 224' coupling it to outer ring member 220', which in turn is resiliently coupled by flat springs 208' to index plate 15, member 326' can come into close proximity with substrate 72 without damaging the substrate while at the same time allowing member 304' to bear against ring-shaped member 220', which in turn bears against chamber half 16, thereby sealing volume 350 from volume 12a. O-ring seals 311' and 321' are provided for maintaining a proper seal. Accordingly, the sputtering operation can now be performed against substrate 72 in chamber volume 350 without contaminating the main volume 12a or contaminating any other station 20, 21 or 23. Once the sputtering operation has been completed, the atmosphere in chamber volume 350 can be purged via vacuum pump 32 and manifold 42, and once the atmosphere in chamber 350 has been purged and the pressures equalized between chamber 350 and chamber volume 12a, back-plane members 304' and 326' can be moved out of engagement or proximity with ring-shape member 220' and substrate 72, respectively, thereby allowing the index plate 15 to rotate the processed wafer 72 to the next station.

FIG. 19 is a more detailed cross-sectional view of station 22 of the present invention taken along lines 19—19 of FIG. 2. Cryogenic vacuum pump 32 and manifold 42 are shown at the bottom of the figure. Back-plane device 47', including actuator 300' is also shown. In this view, details of the cross-section of wafer holding rings 220' and 222' are shown. As shown, inner wafer retaining ring 222' includes hollow sections 223' in which springs 224' are disposed. As shown more clearly in FIG. 19, vacuum pump 32 maintains the proper vacuum level in chamber 350, which is isolated by sealing ring 220' and the O-ring seals 311' and 321' when member 304' biases ring-shaped member 220' against chamber half 16. Back-plane member 326' is provided with electric heater devices 390 which are fed via wire conductors 392. Electric heaters 390 may be necessary in certain instances where it is desired to heat the substrate 72 to an optimum temperature for the particular process being carried out. Additionally, it may also be necessary to cool back-plane member 326' and member 304' to maintain the temperature of substrate 72 at a desired temperature. Accordingly, cooling lines 394 and may be provided for passing a cooling fluid through the back-plane device. Also shown in FIG. 19 are shields 400 and 402, which are provided for shielding retaining ring 222', sealing ring 220' and associated components from the plasma generated during the sputtering operation in space 350.

FIGS. 22 and 23 show further details of station 22. FIG. 22 shows back-plane member 326' prior to its coming into close proximity with substrate 72 held by inner ring 222'. FIG. 23 shows ring 220' after it has been engaged by back-plane member 304'. Back-plane member 326' is also shown in close proximity with substrate 72. Springs 208' allow sealing ring 220' to move toward chamber wall 16. As shown in FIG. 23, springs 208' have been deflected by the force exerted by member 304', against ring member 220'. O-ring seals 311' and 321' seal volume 12a from volume 350. Springs 224' allow for slight movement of ring member 222' and accordingly, substrate 72, with respect to ring 220', thus preventing damage to substrate 72 when back-plane member 326' comes into close proximity therewith.

FIGS. 22 and 23 show further details of the cooling means provided at each of the sputtering stations. For example, fluid cooling lines 410 may be provided to cool the support structure in the area of the substrate 72. The various cooling lines are shown in FIG. 25 at 437. Additional cooling lines may be provided in the area of target 372 as shown at 412 and 412a. Furthermore, the various fasteners, for example, screws 414 which fasten shield 402 to back-plane member 326', generally are provided either with heads with drilled vent holes or the member to which they are fastened is provided with vents 416. Such vents or drilled heads are necessary in order that pockets of air not be trapped beneath the fasteners during assembly, which might otherwise later contaminate the evacuated volumes.

As shown in the drawings, inner ring-shaped member 222' remains in contact with substrate 72 during the performance of each process step, thus preventing particulate formation and breakage of substrate 72 which might otherwise occur if substrate 72 were transferred between different handling mechanisms.

FIG. 25 is a right side view of the overall apparatus shown in FIG. 1. The overall layout of stations 20, 21, 22 and 23 and the various pumps is shown therein. As shown in FIG. 25, chamber half 16 is hinged to chamber half 14 at 425. Suitable locking devices are provided at 427 and shown in sectional view in FIGS. 17 and 18 to lock chamber halves 14 and 16 together. Further hinges 380 allow each of the right side manifold doors of station sections 21, 22 and 23 mounted to chamber half 16 to be opened, for example, for replacement of targets at stations 22 and 23. A station door is shown at 431, for example, in FIG. 18 and FIG. 25. Suitable locking members 429 can be provided for locking each of the right-side station doors in position. FIG. 18 shows station 22 door 431 holding cathode and target support member and cover 370 in the opened position in phantom view, for example. Member 370 may be secured to the station door by bolts or other suitable locking or fastener members.

In the illustrated embodiment, station 21 is an etching station, and accordingly, a cathode and associated cover is not provided. Also, because station 20 is the load-lock, as shown in FIG. 25, no door need be provided at that station.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. Apparatus for exchanging wafer-like articles between a position in a first plane and a processing location in a second plane perpendicular to said first plane with a minimum of motion of the apparatus and where at least part of the movement of each of the articles occurs simultaneously, said apparatus comprising:

a bi-directional longitudinally extending arm having a longitudinal axis lying in a third plane, spaced a fixed distance from and parallel to said first plane at said processing location, a fixed transverse axis perpendicular to said longitudinal axis, and an end rotatable about said longitudinal axis, said arm being pivotal about said transverse axis such that said end is movable essentially only in an arcuate path in said third plane about said transverse axis, at least two engaging means including first and second engaging means each disposed on said arm adjacent said end and spaced essentially said fixed distance from said longitudinal axis so as to simultaneously carry said engaging means along an arcuate path about said longitudinal axis when said arm is rotated thereabout;

said arm being constrained to carry one of said articles engaged by one of said engaging means from said position to said processing location by a combination of movements consisting essentially of a first rotational motion of said arm about said longitudinal axis and a first pivotal motion of said arm about said transverse axis; and said arm being further constrained to carry another of said articles engaged by the other one of said engaging means from said processing location to said position by a combination of movements consisting essentially of a second rotational motion of said arm which includes at least part of the same rotational motion as said first rotational motion, and by a second pivotal motion of said arm;

whereby said articles are exchanged at said processing location without said arm returning to said position.

2. The apparatus recited in claim 1, further comprising cross arm means extending perpendicularly to said longitudinal axis at said end, said first and second engaging means being disposed on opposite ends of said cross arm means, said first and second engaging means comprising vacuum chuck means.

3. The apparatus recited in claim 1, wherein said second location comprises a vacuum chamber having an entry means defined by a load-lock door, and further comprising means for opening said door and means in said chamber for holding an article to be processed in the chamber, said holding means including means for clamping the article thereto, said longitudinally extending arm further comprising means for actuating said clamping means.

4. The apparatus recited in claim 3, wherein said actuating means comprises means disposed adjacent said first and second engaging means and extending perpendicularly to said longitudinally extending arm for engaging said clamping means.

5. The apparatus recited in claim 4, wherein said holding means comprises a plurality of clamping means and said longitudinally extending arm comprises a plurality of actuating means for engaging corresponding ones of said clamping means.

6. The apparatus recited in claim 5, wherein said clamping means comprises rotatable means for clamping an article between a first surface and an extension of said clamping means, said clamping means comprising keyway means, said actuating means comprising key means for engaging with said keyway means, said key means being rotatable in two directions so as to secure said article between said extension of said clamping means and said first surface in one direction and allow removal of the article by disengaging said extension of said clamping means from said article in the other direction.

7. The apparatus of claim 1 further comprising:

means at said position and movable in said first plane, when said arm is pivoted to adjacent said position, for transferring an article to said one of said engaging means or for alternatively retrieving an article from said arm;

said arm being rotatable about said longitudinal axis when adjacent said position to exchange an article transferred by said transferring means to said arm with another article held by said arm, whereby said first article and a third article are transferred to and from said arm by the combined movement of said transferring means and the rotation of said arm when both said arm and said transferring means are at said position.

8. Apparatus for transporting wafer-like articles between a storage location in an external atmospheric environment and an isolatable wafer processing machine in an internal atmospheric environment isolated from said external environment, said machine communicating with said internal environment through a sealable aperture, said apparatus comprising:

carrier means at said storage location for supporting a plurality of said articles;

a chamber for isolating said internal environment from said external environment, said chamber having a wall enclosing said machine in said internal environment;

entry means in said chamber wall alternately in communication with said internal and external environments for permitting transfer of an article therethrough while maintaining isolation between said external and internal environments;

external transfer means for moving articles between movable support means in said external environment and said carrier means;

said movable support means movable between said entry means and said external transfer for transferring articles engaged thereby between said entry means and said external transfer means in said external environment;

first article engaging arm means always in said internal environment and movable between a position within said entry means and an intermediate position for moving articles engaged thereby between said intermediate position and said support means when said support means is within said entry means and said entry means is in communication with said internal environment; and second article engaging arm means always in said internal environment and movable between said intermediate position and said aperture for moving articles engaged thereby between said first arm means at said intermediate position and said aperture of said machine;

whereby said articles are each moved while within said internal environment only by said first and second article engaging arm means which are always isolated from said external environment.

9. The apparatus recited in claim 8, wherein said movable support means comprises means for forming a sealing relationship with a sealing surface arranged around said entry means when an article is inserted through said entry means by said movable support means.

10. The apparatus recited in claim 9, wherein said entry means comprises movable sealing means disposed in said chamber for isolating said entry means from said internal environment.

11. The apparatus recited in claim 10, further comprising valve means for purging the atmosphere in said entry means and for supplying an atmosphere into said entry means having a pressure approximately the same as the pressure in said chamber.

12. The apparatus recited in claim 11, wherein the atmosphere in said chamber comprises a substantially inert, water free atmosphere.

13. The apparatus recited in claim 10, wherein said first arm means is movable in an arcuate path in a first plane and said movable sealing means is movable so as to open said chamber to said entry means when the pressures in said chamber and entry means have substantially equalized, thereby allowing access by said first arm means to said article.

14. The apparatus recited in claim 8, wherein said first arm means is movable in a first plane and said second arm means comprises means pivotable in said first plane or a plane parallel to said first plane and defining an arcuate path for receiving the article at said intermediate position along said path and further being rotatable about a longitudinal extent of said second arm means.

15. The apparatus recited in claim 8, wherein said second arm means comprises first and second engaging means both disposed at a same end of said second arm means, one of the engaging means receiving an article from said first arm means at said intermediate position and transferring the article to the aperture, the other engaging means receiving an article from the aperture and transferring the article to the first arm means at the intermediate position, the second arm means rotating the articles about, said end of said second arm means during a transfer between said aperture and said intermediate position.

16. The apparatus recited in claim 15, further comprising means for receiving said article from the second arm means at said aperture, said receiving means including means for securing the article to the receiving means, said second arm means further comprising means for engaging with said securing means for locking and unlocking said securing means.

17. The apparatus recited in claim 15, wherein said second arm means comprises a longitudinally extending arm extending in said first plane and a cross arm extending a plane perpendicular to said first plane, said cross arm forming a T with said first longitudinally extending arm means, the distal ends of said cross arm having disposed thereon respective ones of said first and second engaging means, said first and second engaging means comprising vacuum chuck means, said first arm means further comprising vacuum chuck means.

18. The apparatus recited in claim 17, wherein said vacuum chuck means of said second arm means comprises a first inner support member and a second member surrounding the first member for engaging the article, said second member coupled to the first member by resilient means.

19. The apparatus recited in claim 18, wherein said resilient means comprises spring means.

20. THe apparatus recited in claim 8, wherein said movable support means has a center axis and comprises means for axially moving said article through said entry means, and further comprising means for centering the article with respect to said center axis of said movable support means.

21. The apparatus recited in claim 20 wherein said wafer-like articles have a periphery lying in a plane normal to said center axis, and wherein said means for centering comprises a plurality of arm means radially movable with respect to said center axis and each having a projection extending substantially parallel to said center axis for engaging the periphery of an article thereon when said radially movable arm means move inwardly toward said article, said plurality of radially movable arm means being disposed equidistantly from and equi-angularly about said center axis, whereby when said radially movable arm means move inwardly, said projections engage the periphery of said article and align the periphery of said article about said center axis.

22. The apparatus recited in claim 20, further comprising means for angularly aligning a portion of the periphery of said article with a defined position on said movable support means.

23. The apparatus recited in claim 22, wherein said portion of the periphery of the article comprises an identifying mark, and said means for aligning comprises means for rotating said movable support means and means for sensing said identifying mark when said identifying mark is rotated into said defined position.

24. The apparatus of claim 8 wherein said second arm means has a pair of wafer engaging means mounted thereon and is operable to exchange articles at said aperture.

25. Method for transporting wafer-like articles between a storage location in an external atmospheric environment and a wafer processing machine in an internal atmospheric environment isolated from said external environment, said machine communicating with said internal environment through a sealable aperture, said chamber having entry means in said chamber wall and alternately in communication with said inner and outer environments to permit transfer of an article therethrough while maintaining isolation between said external and internal environments, said method comprising the steps of:

supporting a plurality of articles in a carrier at said storage location in said external environment;

retrieving a first article from said carrier in said external environment;

exchanging said retrieved first article with a second article on an article support in said external environment;

transporting said first article on said support into said entry means while said entry means is in communication with said external environment;

isolating said first article on said support in said entry means from said external environment and communicating said first article on said support while said support is stationary in said entry means, with said internal environment;

engaging said first article at said support with a first arm in said entry means in said internal environment and transferring said first article with said first arm from said support in said entry means to an intermediate position in said internal environment;

transferring said first article to a second arm in said internal environment and moving said first article, with said second arm, to said machine aperture;

exchanging said first article in said internal environment with a third article at said machine aperture, and;

said articles each being moved while in said internal environment between said entry means and said machine aperture with essentially only said two arms, said two arms being always essentially maintained within said internal environment.

26. The method of claim 25 wherein said first article transferring step comprises the step of moving said first article in a first plane.

27. The method of claim 26 wherein said first and third article exchanging step comprises the step of moving said first and third articles in or parallel to said first plane.

28. The method of claim 27 wherein said moving step comprises the steps of respectively moving first and second arm in or parallel to said first plane.

29. The method of claim 28 wherein said arm moving steps comprise the step of pivoting said respective arms about an axis normal to said first plane.

30. The method recited in claim 25, wherein said isolating and communicating step comprises the steps of forming an entry chamber about said first article on said support, isolating said entry chamber from said first environment, and opening said entry chamber to said second environment.

31. The method recited in claim 30, further comprising the steps of purging the atmosphere in said entry chamber and supplying an atmosphere into said chamber having a pressure approximately the same as the pressure of said second environment.

32. The method recited in claim 31, wherein said step of transferring said first article to a second arm comprises the step of moving an end of said first arm in a first arcuate path in a first plane, and wherein the step of opening said entry chamber to said second environment occurs when the pressures in said chamber and said second environment have substantially equalized, thereby allowing access by said first arm to said first article on said support.

33. The method recited in claim 31, wherein said step of moving said first article with said second arm includes pivoting said second arm parallel to said first plane and rotating said first article about said second arm to transfer said first article from said intermediate portion to said aperture.

34. The method recited in claim 25, further comprising the step of linearly moving said first article on said support and centering the article on said support.

35. The method recited in claim 34 wherein said first article has a periphery, and said method further comprises the step of aligning a portion of the periphery of the article with a defined position on said movable support means.

36. A method for exchanging processed with unprocessed wafer-like articles and transferring said articles between a first location in a first plane and a second processing location at the intersection of a second plane and a third plane parallel to and spaced from the first plane, said method comprising the steps of:
receiving a first article from said first location at a first movable position adjacent and spaced a fixed distance from a longitudinal axis lying in the third plane; then
pivoting said longitudinal axis in the third plane about a different axis perpendicular to the first and third planes and fixed with respect to the processing location to carry said first article in a first direction from said first location toward said second location; then
engaging a second article at said second location at a second movable position adjacent and spaced said fixed distance from said longitudinal axis; then
simultaneously rotating both said first and second movable positions and said first and second articles about said longitudinal axis, then
depositing said first article at said second location; then
pivoting said longitudinal axis about said different axis in said third plane to carry said first and second movable positions and said second article in a second direction opposite said first direction from said second location to said first location; then
transferring said second article to said first location.

37. The method of claim 36 further comprising the steps of:
after receiving said first article, rotating said first article and a third article simultaneously along said second arcuate path about said longitudinal axis, then
transferring said third article to said first location, then
performing said first recited pivoting step.

38. The method of claim 62 further comprising the steps of:
after said second recited pivoting step, receiving a fourth article from said first location, then
rotating said fourth and second articles simultaneously along said second arcuate path about said longitudinal axis, then
performing said second article transferring step.

* * * * *